United States Patent
Bukofsky et al.

(10) Patent No.: US 6,451,508 B1
(45) Date of Patent: Sep. 17, 2002

(54) PLURAL INTERLEAVED EXPOSURE PROCESS FOR INCREASED FEATURE ASPECT RATIO IN DENSE ARRAYS

(75) Inventors: Scott J. Bukofsky, Hopewell Junction, NY (US); Gerhard Kunkel, Radebeul (DE); Alan C. Thomas, Hughsonville, NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/561,472

(22) Filed: Apr. 28, 2000

(51) Int. Cl.⁷ .................................................. G03F 7/20
(52) U.S. Cl. ....................... 430/311; 430/312; 430/394; 430/396
(58) Field of Search ................................. 430/311, 312, 430/394, 396

(56) References Cited

U.S. PATENT DOCUMENTS

| | | | |
|---|---|---|---|
| 4,702,592 A | * 10/1987 | Geiger et al. ................. 355/53 |
| 5,308,741 A | 5/1994 | Kemp ........................ 430/312 |
| 5,563,012 A | 10/1996 | Neisser ....................... 430/22 |
| 5,780,188 A | * 7/1998 | Rolson ........................ 430/30 |
| 5,815,245 A | 9/1998 | Thomas et al. ............... 355/43 |
| 5,854,671 A | 12/1998 | Nishi ......................... 355/53 |
| 5,905,020 A | * 5/1999 | Hu et al. .................... 430/394 |
| 5,972,567 A | * 10/1999 | Hu et al. .................... 430/312 |
| 6,042,998 A | * 3/2000 | Brueck et al. ............... 430/316 |
| 6,136,517 A | * 10/2000 | Fletcher ...................... 430/394 |
| 6,261,727 B1 | * 7/2001 | Wang ............................ 430/5 |
| 6,278,123 B1 | * 8/2001 | Hu et al. .................... 250/492.2 |

* cited by examiner

Primary Examiner—Janet Baxter
Assistant Examiner—Amanda C. Walke
(74) Attorney, Agent, or Firm—Graham S. Jones, II; H. Daniel Schnurmann

(57) ABSTRACT

A method for exposing a workpiece in a dual exposure step-and-repeat process starts by forming a design for a reticle mask. Deconstruct the design for the reticle mask by removing a set(s) of the features that are juxtaposed. Form unexposed resist on the workpiece. Load the workpiece and the reticle mask into the stepper. Expose the workpiece through the reticle mask. Reposition the workpiece by a nanostep. Then expose the workpiece through the reticle mask after the repositioning. Test whether the plural exposure process is finished. If the result of the test is NO the process loops back to repeat some of the above steps. Otherwise the process has been completed. An overlay mark is produced by plural exposures of a single mark. A dead zone is provided surrounding an array region in which printing occurs subsequent to exposure in an original exposure. Stepper-framing-blades are moved over the dead zone to prevent additional exposures after an initial exposure. Alternatively, the workpiece can be fully exposed first by stepping a series of full steps, then going back to the starting position, making a nanostep to reset the starting position and re-exposing from the reset starting position in the same way with full steps from the nanostepped position.

13 Claims, 16 Drawing Sheets

US 6,451,508 B1

PLURAL INTERLEAVED EXPOSURE PROCESS FOR INCREASED FEATURE ASPECT RATIO IN DENSE ARRAYS

CROSS REFERENCE TO RELATED APPLICATION

This application is related to commonly-assigned, copending U.S. patent application Ser. No. 09/561,419 filed on Apr. 28, 2000 of Scott Bukofsky, et al. for MULTIPLE EXPOSURE PROCESS FOR FORMATION OF DENSE RECTANGULAR ARRAYS and subject matter described therein is incorporated herein by reference.

BACKGROUND OF THE INVENTION

1. Field of the Invention

This invention relates to a process for manufacturing semiconductor devices and more particularly to an improved step-and-repeat method of exposing arrays of patterns in the formation of components of integrated circuit semiconductor devices.

2. Description of Related Art

U.S. Pat. No. 5,563,012 of Neisser for "Multi Mask Method for Selective Mask Feature Enhancement" describes a method for forming a mask by dividing or grouping pattern shapes into shape groups according to feature types. Two or more overlay masks can contain complementary pattern shapes which are employed sequentially. As stated at Col. 3, lines 46–48, "Thus the entire pattern of the original mask is printed by successive of the overlay mask patterns on to the photoresist." This requires removing a mask and substituting one or more complementary masks for the original mask.

U.S. Pat. No. 5,308,741 of Kemp for "Lithographic Method Using Double Exposure Techniques, Mask Position Shifting and Light Phase Shifting" describes a method of "using double exposures, physical mask shifting and light phase shifting to form masking features on a substrate masking layer. A first Phase Shifting Mask (PSM) is used to form at least one image by exposing a mask at a first location. A second exposure is made using either a second PSM or reusing the first PSM. The PSM used in the second exposure is positioned to partially overlap the original position of the first PSM. If the first PSM is reused, it is shifted to a second exposure position. In either case, in the second exposure the regions of the substrate with first and second exposures have some common unexposed regions which are used to form the masking features. If the first mask is reused it can be shifted by a rectilinear or rotational displacement into the second position. After removal of the exposed resist there are a plurality of unexposed regions on the substrate.

U.S. Pat. No. 5,815,245 of Thomas et al. for "Scanning Lithography System with Opposing Motion" describes a scanning photolithography system which uses opposing motion of a reticle and a blank to compensate for image reversal by a projection system such as a conventional Wynne-Dyson optical system which forms a reverted image on a blank. During scanning the reticle moves in a direction opposite to the direction in which the blank moves. Linear motors are used. See Col. 14, lines 16–20, where it is stated "Typically, relative motion is provided by a microstepper or other precision motor driving the secondary stage under control of a conventional control mechanism receiving feedback from the reticle alignment system."

SUMMARY OF THE INVENTION

In accordance with this invention a method and a system are provided for exposing a workpiece in a dual exposure step-and-repeat process starts by forming a design for a reticle mask. Deconstruct the design for the reticle mask by removing a set(s) of the features that are juxtaposed. Form unexposed resist on the workpiece. Load the workpiece into a stepper. Load the reticle mask into the stepper. Expose the workpiece through the reticle mask. Reposition the workpiece by a nanostep. Then expose the workpiece through the reticle mask after the repositioning. Test whether the plural exposure process is finished. If the result of the test NO the process loops back to repeat the process. Otherwise the process has been completed. An overlay mark is produced by plural exposures of a single mark. A dead zone is provided surrounding an array region in which printing occurs subsequent to exposure in an original exposure. Stepper-framing-blades are moved over the dead zone to prevent additional exposure.

Alternatively, the workpiece can be fully exposed first by stepping a series of full steps from the start position to the end of the area to be exposed. Then go back to the starting position. Then make a nanostep to reset the starting position. At that point re-expose from the reset starting position in the same way with a series of full steps from the reset starting position which carries the nanostep offset forward.

DESCRIPTION OF THE DRAWINGS

The foregoing and other aspects and advantages of this invention are explained and described below with reference to the accompanying drawings, in which.

DESCRIPTION OF THE PREFERRED EMBODIMENT

In accordance with this invention a dual exposure process is provided which can be employed to increase the trench aspect ratio in a product such as a $6M^2$ DRAM cell. Image shortening behavior is a critical detractor in achieving a 2:1 trench aspect ratio for $6M^2$ DRAM cells. Due to the small amount of space (1M where "M" is the minimum feature size i.e. smallest dimension of a feature) between features on a reticle mask, there is insufficient room to bias the shapes to achieve the desired aspect ratio. This invention utilizes a dual or plural exposure technique to provide additional room for reticle mask bias, as well as an increased amount of diffracted energy in the lens pupil. These factors allow image shortening effects to be circumvented and the desired trench length achieved.

This same technique can be applied to other 2-D features such as electrode level/capacitor level (EL)/CC) levels for stacked capacitor cells, and to dense contact hole arrangements.

Figure 1:
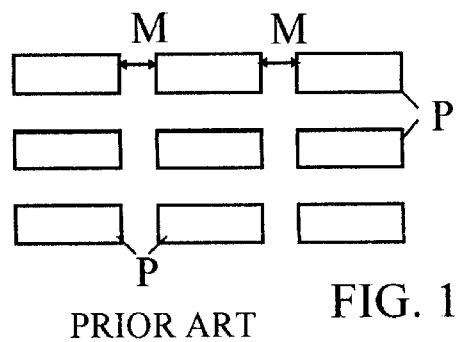
FIG. 1 shows a small portion of an original desired Deep Trench (DT) reticle mask layout for one exposure field of a $6M^2$ DRAM cell comprising a portion of an array of three vertical columns by three horizontal for the capacitors.

This invention deals with solutions to problems in the imaging of dense arrays of patterns. FIG. 1 shows a small portion of an original desired Deep Trench (DT) reticle mask layout for one exposure field of a $6M^2$ DRAM cell comprising a portion of an array of three vertical columns by three horizontal for the capacitors. Note that there is only a 1M space (M=minimum feature size) between features, leaving little room for reticle mask bias. FIG. 1 shows an array of identical patterns P which are to be produced. When using a photolithographic process to expose photoresist to produce the desired patterns P seen in FIG. 1, the patterns P are spaced at regular distances on a reticle mask, consisting of rectangular clear features on an opaque background. Such patterns P are of crucial importance in semiconductor manufacturing, and are used in many different technologies such as the capacitor level in trench-based DRAM cells, electrode patterns in stacked capacitor DRAMs, contact arrangements in both DRAM and microprocessors, and many others.

Figure 2:
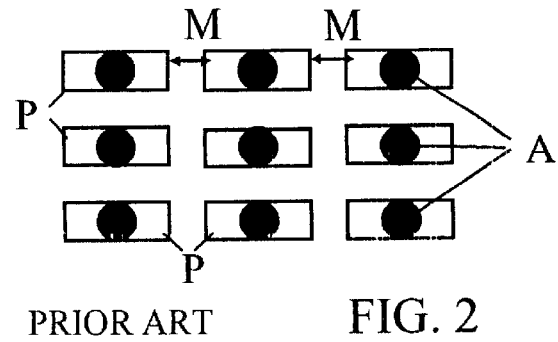
FIG. 2 is a schematic diagram showing an array of narrow rectangular patterns in a reticle mask which were intended to produce an identical pattern in the photoresist with an array of circular imaged patterns which were produced superimposed thereon.

Although a desired array of patterns P such as the array seen in FIG. 1 is present in a reticle mask, the resultant pattern exposed through the mask in the photoresist frequently deviates from the original pattern on the reticle mask. For example, in patterns P, such as the narrow rectangles of FIG. 1, square corners are often rounded and the ends of the rectangles are shortened. FIG. 2 is a schematic diagram which shows an array of narrow rectangular patterns P in a reticle mask which were intended to produce an identical pattern in the photoresist with an array of circular imaged patterns A superimposed on the patterns P. The patterns A are based upon actual features produced using a reticle mask with patterns P. As explained above the rounding of the corners at the ends and the shortening of the rectangles has produced that array of circular images A produced from reticle mask patterns P. Images A are shorter than patterns P and the ends of the rectangles in the patterns P have been rounded to produce the circular images A. This illustrates the problem of line shortening which is especially important in the types of applications wherein the length of the printed image is critical. The problem is that the phenomenon of image shortening leads to undesirably short images A which are produced from the rectangular patterns P in FIGS. 1 and 2. The shortening illustrated by FIG. 2 cannot be overcome simply by employing reticle mask bias, since patterns P were too close together on the reticle mask used to produce the images A. Additionally, the extremely small distance between the features of patterns P makes the process of reticle mask fabrication and inspection difficult.

Figure 3:
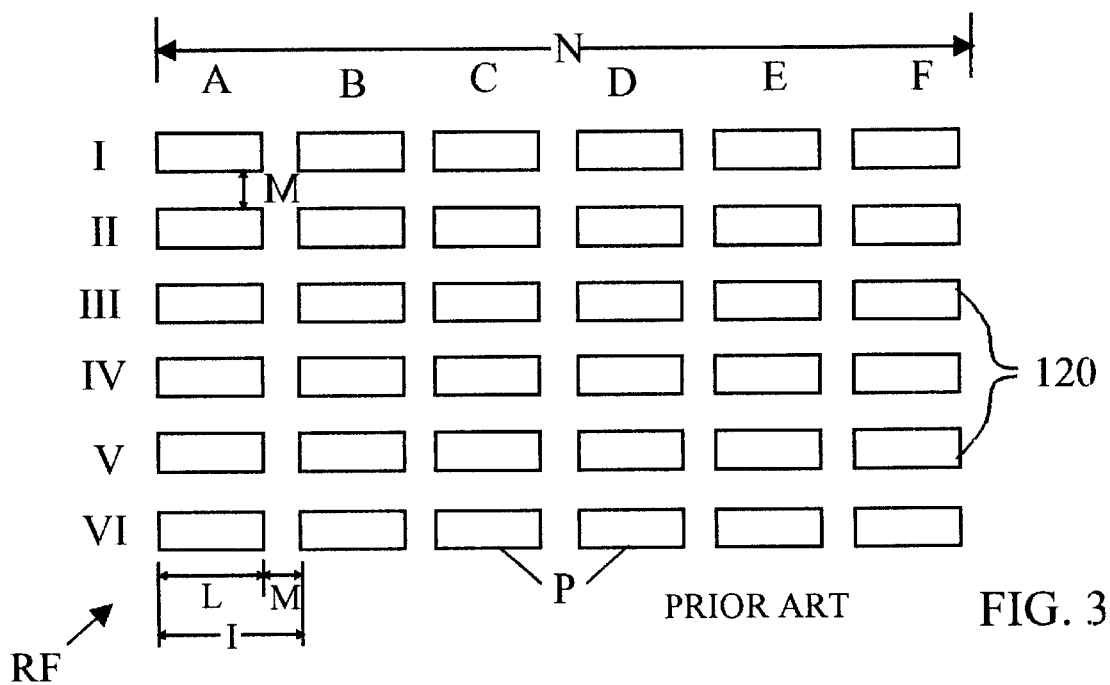
FIG. 3 shows an original reticle mask layout for exposure of a single field to be exposed in a stepper in a step-and-repeat fashion.

FIG. 3 shows a Prior Art reticle mask RF for exposing a field comprising an array of thirty-six patterns P of the kind shown in FIG. 1 representing an original reticle mask layout for a desired Deep Trench (DT) layout of a portion of an array of six vertical columns A–F by six horizontal rows I–VI for a set of capacitors for a $6M^2$ DRAM cell. Note that there is only a 1M space (M=minimum feature size) between features, leaving little room for reticle mask bias. A conventional reticle mask would have a pattern substantially identical to the pattern seen in FIG. 3. The rectangular patterns P have a length of L and they are spaced apart by the distance M. In FIG. 3, the horizontal distance (interval) "I" along the x axis at which patterns P repeat is as follows:

$I=L+M$

The width of the field shown in FIG. 3 is N where N is defined for the six columns A–F as follows:

$N=6\ I=6L+6M$

Assume in FIG. 3 that the relative motion imparted by the stepper stage with respect to reticle mask RF is from left to right so that it will expose the field shown with its width N and then the stepper will move to expose the next field to the right of column F.

This invention involves breaking up the desired field of patterns P to be exposed shown in FIG. 3 into a more sparse array. The final array of patterns P in the field produced is formed from two exposures.

Although it is desired that the trenches should have an aspect ratio (length/width) of 2; due to image shortening the maximum aspect ratio is smaller. Lengthening of the trenches on the reticle mask is insufficient due to the lack of room between neighboring trenches. Additionally, due to the tight pitches of the layout, very few Fourier components fall within the lens pupil, as shown in FIG. 9A.

Figure 9A:
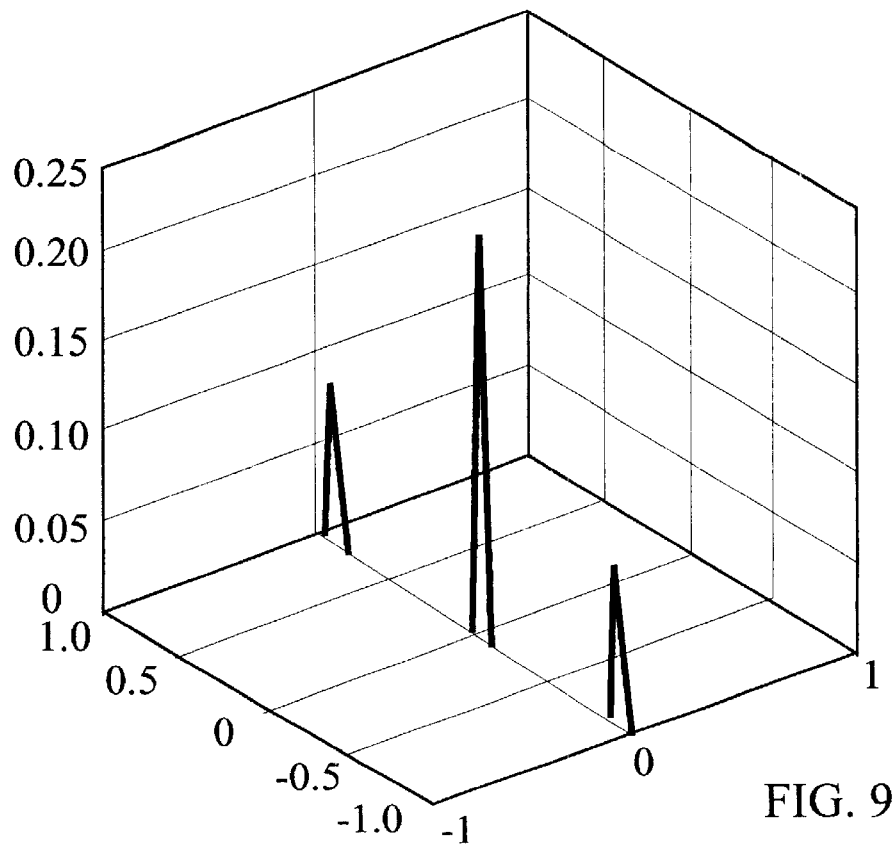
FIG. 9A shows a Fourier spectrum of reticle mask layout for an original cell.

FIG. 9A shows a Fourier spectrum of reticle mask layout for an original cell.

Figure 9B:
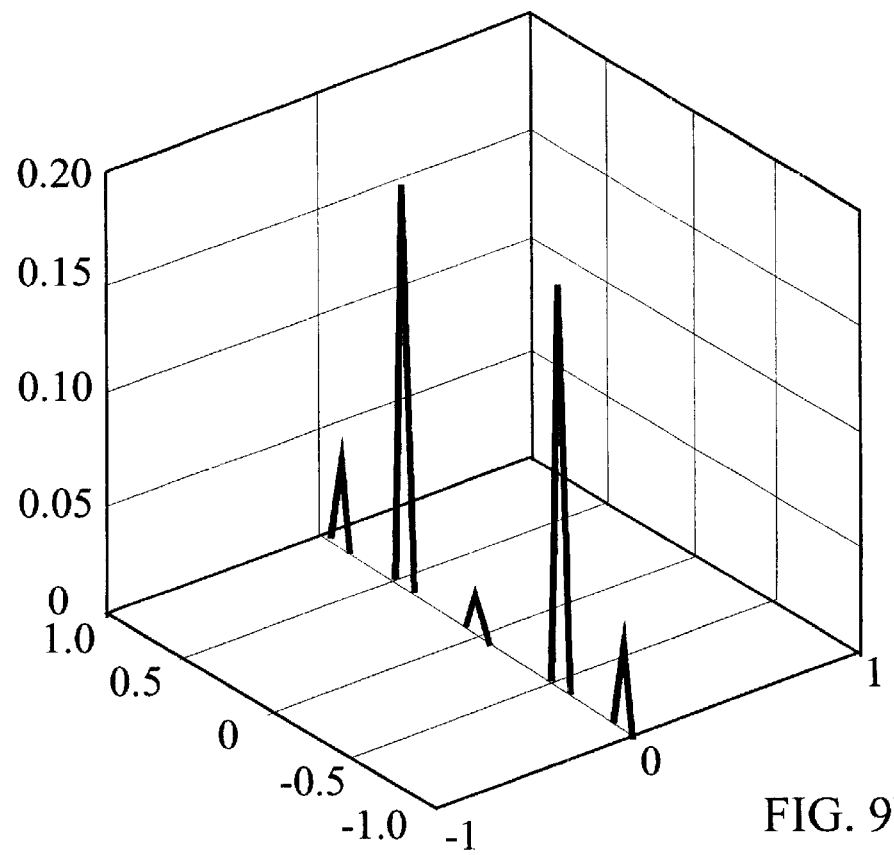
FIG. 9B shows a Fourier spectrum of reticle mask layout for a dual exposure cell.

FIG. 9B shows a Fourier spectrum of reticle mask layout for a dual exposure cell in accordance with this invention.

Figure 4:
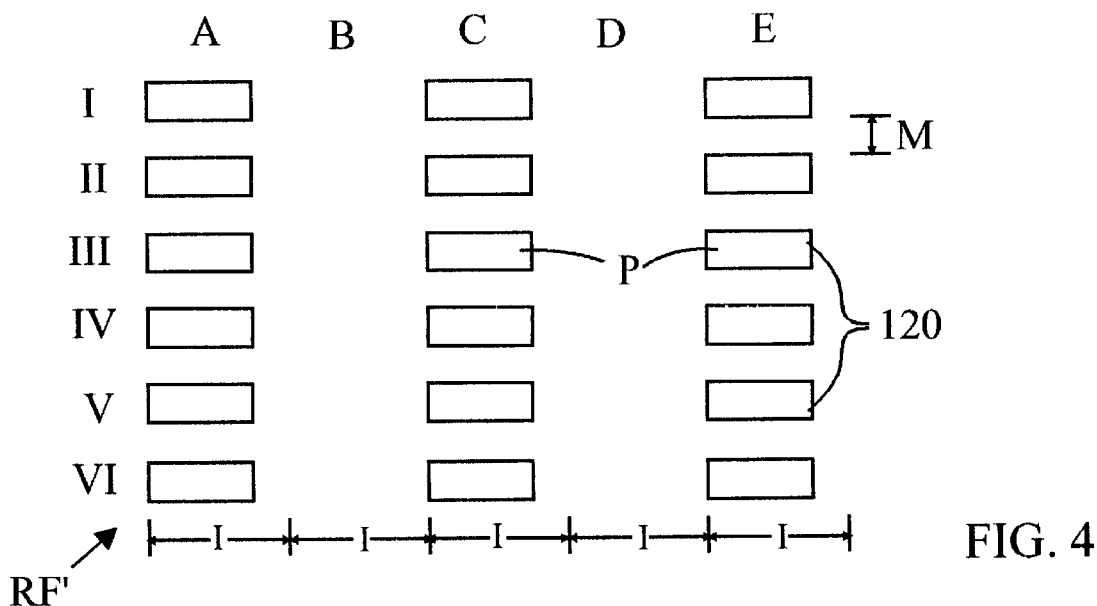
FIG. 4 shows an altered, dual exposure reticle mask layout adapted for used in a dual exposure process.
Figure 5:
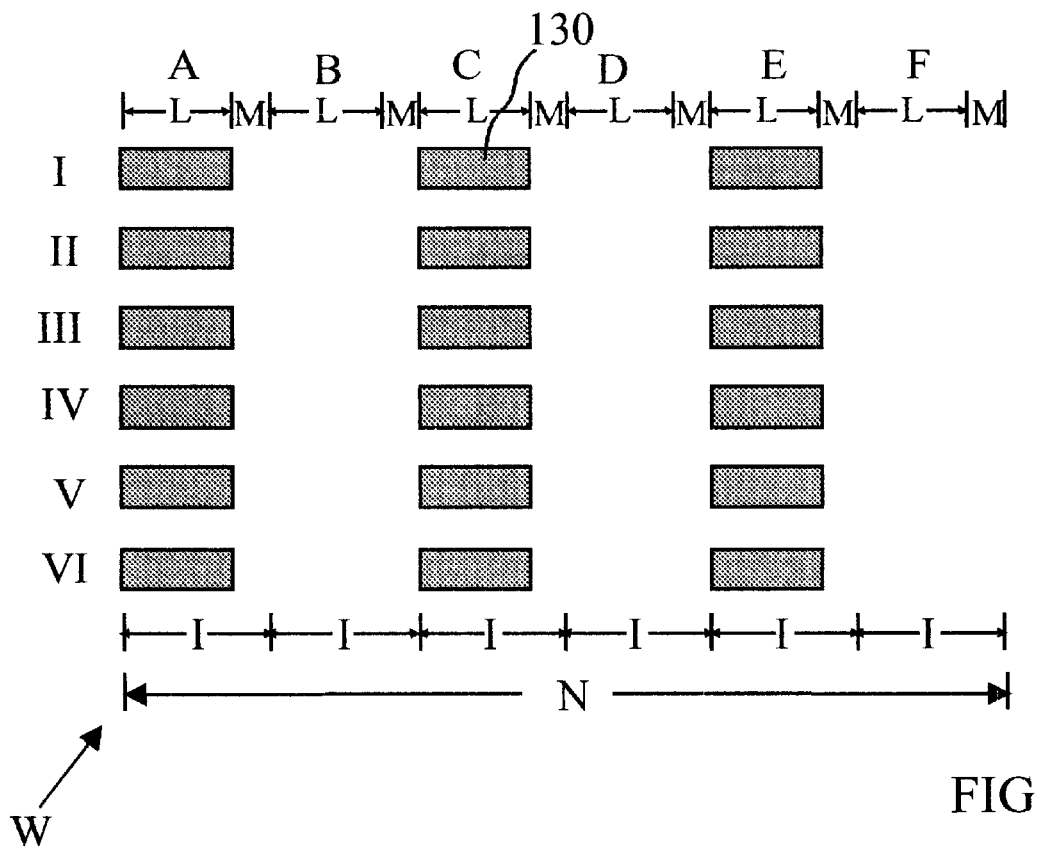
FIG. 5 shows a workpiece which has been exposed to only a first exposure in a first position to a field of patterns on the dual exposure reticle mask of FIG. 4.
Figure 6:
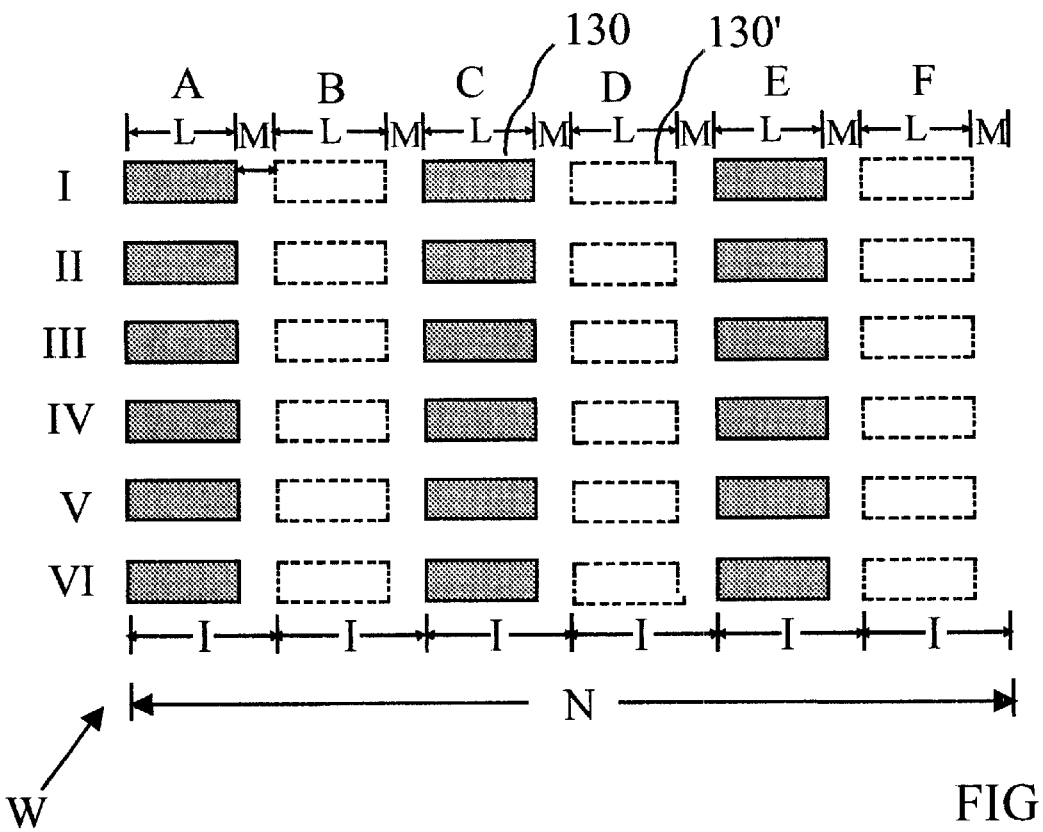
FIG. 6 shows the workpiece of FIG. 5 after a second one of dual exposures to the field of patterns on the reticle mask RF' which in this case have been exposed in a second position a nanostep interval "I" away from the first exposure.

In order to circumvent these problems, this invention breaks up the base pattern into alternate columns of deep trenches (DTs), as shown by FIGS. 4, 5, and 6 as is explained below. This has two advantages as follows:
(1) There is now more room on the reticle mask to bias the features since the neighboring pattern P has been removed, and
(2) Since the pitch in one direction has been doubled, the corresponding Fourier spectrum is compressed as shown in FIG. 9B. Additional diffracted components have now entered the lens, increasing pattern fidelity and reducing imaging shortening.

Figure 10:
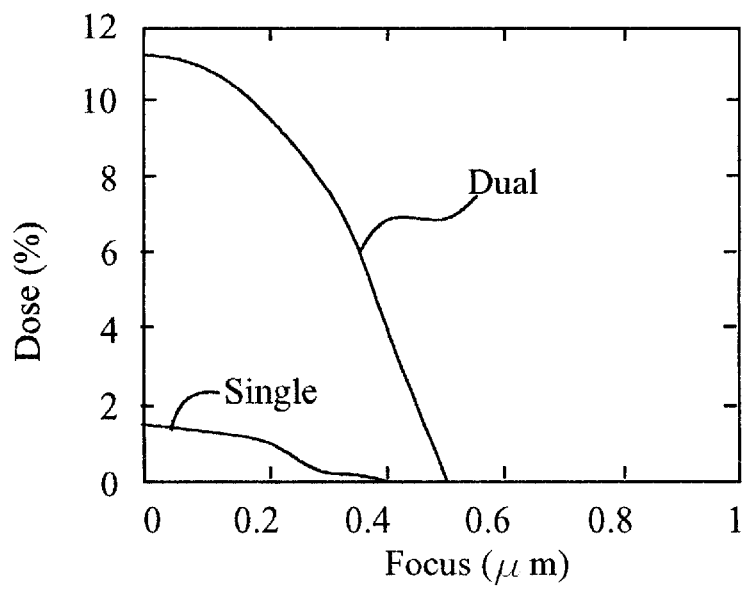
FIG. 10 is a graph of dual exposure and single exposures of dose vs. focus.

FIG. 10 is a graph of a lithographic process window showing dual exposure and single exposures of dose vs. focus. The process window is a measure of the ability of a lithographic process to maintain a desired critical dimension through a range of focus and dose conditions. FIG. 10 compares the process window for a combined length-width metric for the base layout of FIG. 3 and the dual exposure invention layout of FIG. 4

The vertical axis indicates the dose percentage, from 0% to 12%. The horizontal axis indicates focus values from 0 $\mu$m to 1 $\mu$m. The curve for the single exposure with original layout begins at a dose of about 1.7% at 0 $\mu$m and drops to zero near a focus of 0.4 $\mu$m. In contrast, the dual exposure curve begins at a dose of 11% at 0 $\mu$m and drops to a dose of 0% at a focus of 0.5 $\mu$m. These simulations assume attenuated Phase Shift Mask (PSM) and annular illumination. The dual exposure technique shows far superior performance as shown by the dual exposure curve.

FIG. 4 shows a reticle mask RF' which has a mask layout comprising a modification of the layout shown in FIG. 3. The layout of reticle mask RF' of FIG. 4 is suitable for use for dual-interleaved exposure process using the single reticle mask RF' to form the pattern shown in FIG. 3 in accordance with the method of this invention.

FIGS. 5 and 6 illustrate the result of the use of the reticle mask RF' of FIG. 4 in a dual (plural) exposure process used to form a final desired pattern in accordance with this invention by "nanostepping" in which distances of stage movement are quite small compared with typical stage movements during wafer exposure in which the reticle mask is moved the full length of the reticle mask between exposures in what is referred to as a full step.

FIG. 5 shows a workpiece W which has been exposed to only the first exposure from reticle mask RF' in a first position. The result is a field of rectangular patterns P' matching the rectangular patterns P of the dual exposure reticle RF' of FIG. 4 in accordance with this invention.

Subsequent to the first exposure shown in FIG. 5, instead of moving the entire length of the field of the reticle mask RF', the exposure tool stage is then moved an ultra small "nanostep" and exposed again to fill in the remaining patterns P as shown in FIG. 6. As is well known by those skilled in the art, the "stage" is the portion of the tool upon which the workpiece W is located during exposure. The stage is precisely moved by a precision stepper motor by a conventional commercially available step-and-repeat machine of the kind well known by those skilled in the art programmed to move the workpiece W relative to the reticle mask RF' in accordance with this invention. The stepper motors are designed for stepping the tool from a first field to be exposed in a first position to a second field to be exposed at a second adjacent position in a step-and-repeat sequence of exposures and steps where each new field is immediately adjacent to the preceding field.

FIG. 6 shows the workpiece W of FIG. 5 after a second one of the dual exposures to the field of patterns P on the reticle mask RF' which in this case have been exposed in a second position an interval "I" away from the first exposure. This completes the dual-interleaved exposure process of the first field of a series of fields to be exposed by a stepper in the dual exposure process in accordance with this invention. Thus, FIG. 6 shows a field of patterns P which have been exposed in both the first and the second of two exposures in a dual exposure process in accordance with this invention.

Referring again to FIG. 4 the patterns P for columns B, D and F have been omitted from the reticle mask RF'. In the position shown, the reticle mask RF' of FIG. 4 can expose only the columns A, C, and E of the first field to be exposed.

Referring again to FIG. 5, the workpiece W is shown after having received an exposure that is the result of the first exposure with the reticle mask RF' of FIG. 4 in its initial position relative to workpiece W. To complete the exposure of a single field as shown in FIG. 6 requires repeating the use of the reticle mask RF' of FIG. 4 only after the relative position of the workpiece W and reticle mask RF' has been been nanostepped (moved) by the distance "I" (i.e. interval "I") to a second position. The nanostepping movement to the second positions requires movement by the extremely small distance "I" instead of the distance N as is required in the Prior Art method of FIG. 3, to complete exposure of all of the patterns P of the field shown in FIG. 3. In the second exposure position, reticle mask RF' is employed to expose the complementary patterns P in columns B, D and F to the exposure of A, C, and E of FIG. 5 to produce the pattern seen in FIG. 6.

Then after the exposure of patterns P for columns B, D and F, the relative position of reticle mask RF' with respect to the workpiece W must move the distance N–I to expose the columns A, C, and E of the next field which is to be exposed. The movement of the reticle mask RF' relative to the workpiece W by the distance N is a full step. The movement of the reticle mask RF' relative to the workpiece W by the distance "I" is referred to herein as a "nanostep" (stutter-step) which is done by operating the stepper alternately first taking a nanostep moving after the first exposure in FIG. 5 the distance "I", then taking a full step moving the distance "N–I" after the first exposure in FIG. 6, then again nanostepping the distance "I" in the nanostepping mode. Later, if necessary, the stepper continues to operate taking a full step "N–I" followed by another nanostep "I" and so forth in what could be referred to as alternate steps and (nano) steps. To reproduce the original reticle mask RF of FIG. 3 by the method of this invention, as described above for reticle mask RF' of FIG. 4, after producing the result shown in FIG. 5 the reticle mask R' is nanostepped to fill in the additional column producing the result seen in FIG. 6.

Figure 11A:
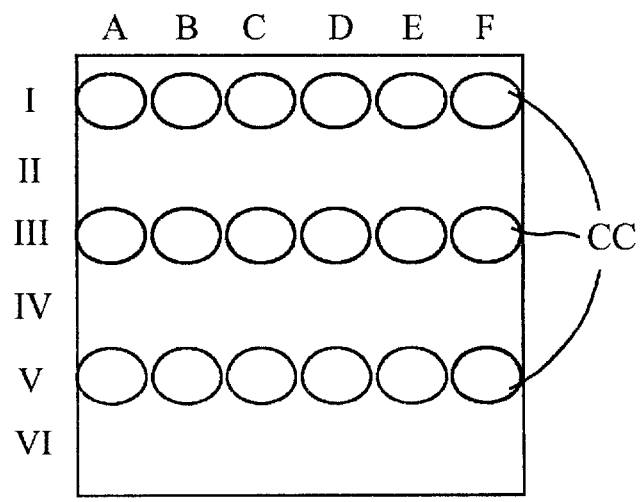
FIG. 11A shows normal operation of a typical stepper to expose a reticle mask with minimal exposure.
Figure 11B:
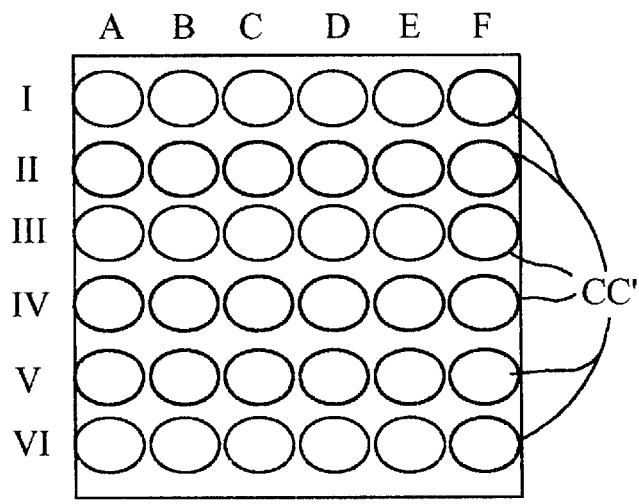
FIG. 11B illustrates the result of using a reticle which has been nanostepped and exposed again to fill in the empty columns or other spaces.

FIG. 11A shows normal operation of a typical stepper to expose a reticle mask with minimal exposure. We found that one can operate exposure tools to perform a nanostepping function producing the results shown in FIG. 11B. On the other hand FIG. 11B illustrates the result of using a reticle which has been nanostepped and exposed again to fill in the empty columns or other spaces. FIG. 11A shows normal operation of a typical stepper to expose a reticle mask with minimal exposure.

FIG. 11B illustrates the result of using a reticle which has been nanostepped and exposed again to fill in the empty columns or other spaces with elliptical shapes CC'.

We also point out that this process is directly applicable to capacitor level and to the electrode level for stacked capacitor cells, as well as densely packed contact hole arrangements.

Deconstruction of Reticle Mask

FIG. 4 illustrates the principle of deconstruction of an array of pattern elements P to provide a modified reticle mask RF' which includes a fraction of the pattern elements P of the original reticle mask RF. The decomposition of the array of pattern elements P in the reticle mask RF serves several important purposes. First, the process of fabrication of reticle mask RF is a considerably easier, since there is more space between pattern elements or features on the reticle mask RF' as contrasted with reticle mask RF. Image fidelity is improved due to the relaxation of the feature pitch. Additionally, image shortening can be compensated, since there is now much more room between features to bias the reticle mask. This use of nanostepping (as opposed to using two separate reticle masks) is also beneficial since only one reticle mask is required, and there is no component of reticle-reticle overlay introduced into the process.

Method of Deconstruction of Reticle Mask

We also note that the arrangement of pattern elements P in reticle mask RF' in FIG. 4 is not the only way to modify the arrangement of pattern elements P for use in a dual exposure reticle mask RF'.

Figure 7:
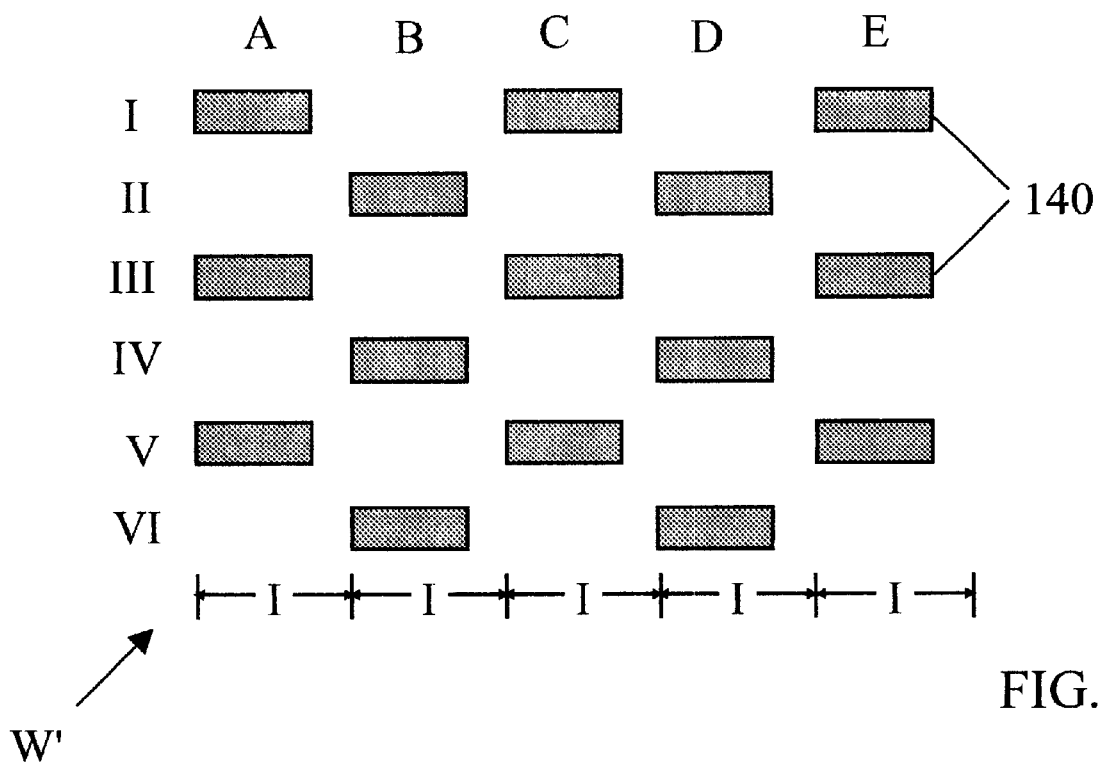
FIG. 7 shows a workpiece which has been exposed once by a reticle mask with a modified checkerboard pattern of rectangular elements adapted for use with the dual exposure method.
Figure 8:
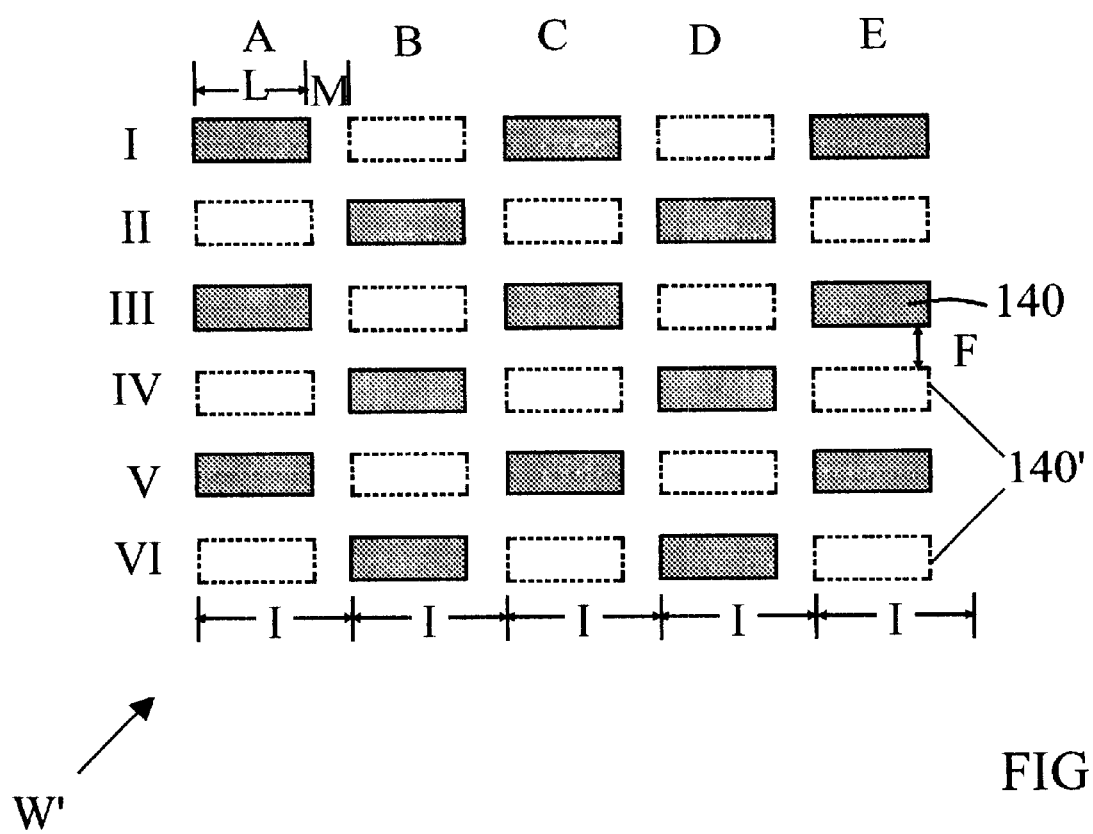
FIG. 8 show the workpiece of FIG. 7 after exposure of the workpiece through the reticle mask after a nanostep with the same modified checkerboard pattern of elements employing the dual exposure method.

FIGS. 7 and 8 show a workpiece which has been exposed by a reticle mask with an alternate arrangement of pattern elements (not shown) which are in the positions of the marks 140 produced on workpiece W'.

FIG. 7 shows a workpiece which has been exposed once by a reticle mask with a modified checkerboard pattern of rectangular elements adapted for use with the dual exposure method of this invention. In FIG. 7 reticle mask has been designed with alternate features 140 omitted in a checkerboard pattern from rows II, IV and VI of columns A, C and E and rows I, III and V of columns B and D.

FIG. 8 show the workpiece of FIG. 7 after exposure of the workpiece through the reticle mask after a nanostep with the same modified checkerboard pattern of elements employing the dual exposure method of this invention. In FIG. 8, after nanostepping to the right the empty spaces in the pattern of FIG. 7 are filled with the features 140' shown in phantom. Features 140' fill rows II, IV and VI of columns A, C and E and rows I, III and V of columns B and D.

Practical Issues

There are many practical issues associated with implementing a plural (dual) exposure process, especially when a nanostepping technique is used rather than a two-reticle mask option. These practical issues are fundamental to this invention, and are outlined briefly below.

1) Kerf Issues

Figure 12A:
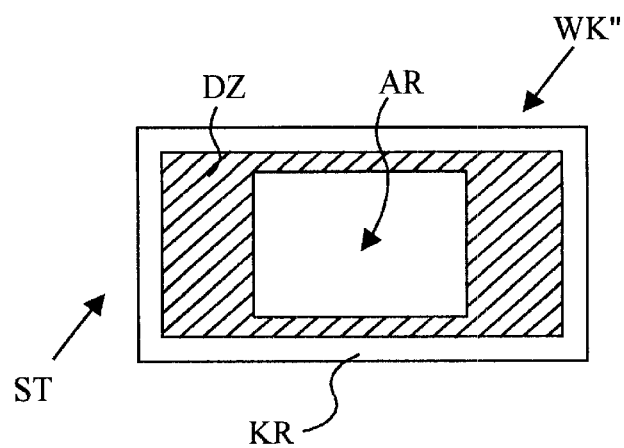
FIG. 12A shows a workpiece, in a stepper, on which are formed an array, a dead zone region around the array and a kerf region.
Figure 12B:
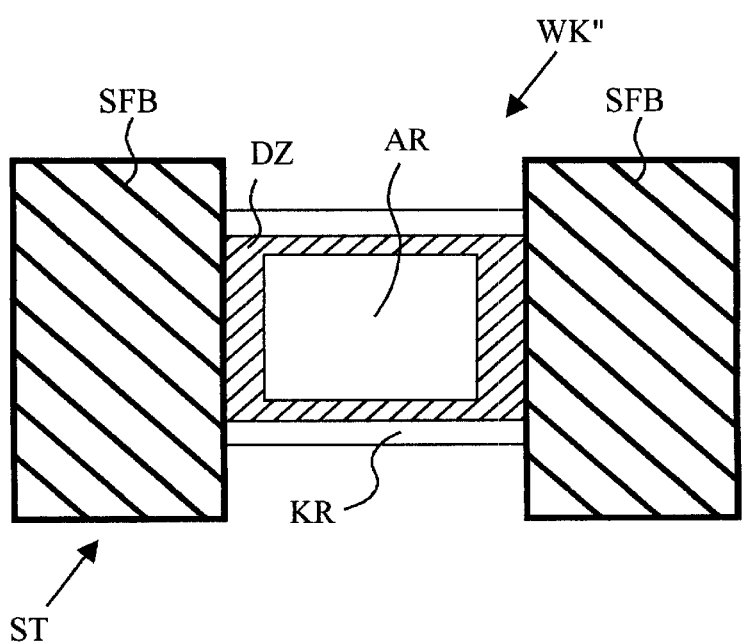
FIG. 12B shows the workpiece of FIG. 12A after stepper framing blades have been added. The kerf region contains overlay marks and other measurement structures.

FIGS. 12A and 12B show how to protect the kerf KR during dual exposure of a workpiece WK". The kerf region KR contains overlay marks and other measurement structures which must be protected from re-exposure during the nanostep exposure.

FIG. 12A shows a workpiece WK", in a stepper ST, on which are formed an array AR, a dead zone region DZ around the array AR and a kerf region KR. The array portion AR is the region where exposure during stepping and nanostepping occurs, but the surrounding optical kerf KR needs to be protected. In FIG. 12A, since a real integrated circuit contains features other than the dense array features (array portion AR) described above, it is necessary to consider what is to be done with the kerf region KR. Most importantly, overlay measurement structures and other features in the kerf region KR may not be amenable to nanostepping.

Figures 13A, 13B:
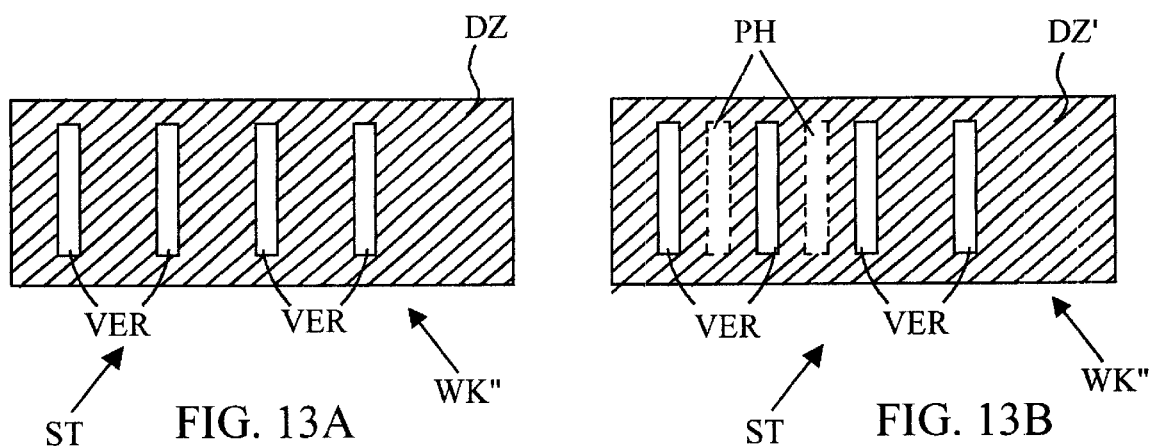
FIGS. 13A and 13B show a set of clear verniers which are introduced into the dead-zone of the workpiece of FIGS. 12A and 12B.

FIG. 12B shows the workpiece WK" of FIG. 12A after stepper-framing-blades SFB have been added. FIGS. 13A and 13B show a set of clear verniers which are introduced into the dead-zone of the workpiece of FIGS. 12A and 12B. FIG. 12B shows an example of how stepper framing blades SFB are used to cover portions of an opaque "dead-zone" DZ in FIGS. 13A and 13B. In order to ameliorate this problem, the exposure tool stepper-framing-blades SFB are used to protect certain areas during the second exposure. Note that the stepper-framing-blades SFB are opaque. After the first exposure, stepper-framing-blades SFB are moved inwardly to protect the kerf KR. See U.S. Pat. No. 5,854,671 of Nishi for "Scanning Exposure Method and Apparatus Therefor and a Projection Exposure Apparatus and Method which Selectively Chooses Between Static Exposure and Scanning Exposure" shows of stepper adopting a former step-and-repeat process includes a shutter with a pair of stepper framing blades $BL_1$, $BL_2$, $BL_3$ and $BL_4$. Blades $BL_1$ and $BL_2$ are located on top. Blades $BL_3$ and $BL_4$ are located below. The blade edges of blades $BL_1$ and $BL_2$ extend parallel to the scan direction and they determine the width of the scan whereas the two stepper framing blades $BL_3$ and $BL_4$ which are oriented at right angles to blades $BL_1$, $BL_2$ determine the length of the aperture. There is a main control unit 100 which controls the stepper and the blades.

In this example, the left and right sides of the kerf KR are protected, and the top and bottom are left unprotected. In principle, all sides could be protected by employing additional stepper-framing-blades SFB on the top and the bottom.

1(a) Framing Blade Precision

The example shown in FIGS. 12A and 12B is somewhat simplified, in that the exposure tool framing blades are typically poorly controlled relative to the feature sizes being imaged in modem integrated circuits. In order to prevent the uncertainty in blade position as well as the penumbra associated with the blades from interfering with the desired images, an opaque "dead zone" DZ is introduced between the array portion AR and the kerf KR, as shown in FIGS. 12A and 12B. This provides an area for the blades SFB to land in without the possibility of affecting the array portion AR.

1(b). Framing Blade Metrology

Since the movement and placement of the stepper-framing-blades SFB is important, the opaque dead-zone DZ allows for metrology of the position of the blades SFB. Accordingly, referring to FIG. 13A, a set of clear verniers VER is introduced in the deadzone of the workpiece WK" of FIGS. 12A and 12B. The verniers are designed on a pitch of 21 such that, after two exposures, a series of equal lines and spaces are produced. However, during the second exposure, the framing blades will cover a certain amount of the verniers VER forming a printed image as seen in FIG. 13B. The change in apparent pitch of the lines and spaces imaged by the verniers is used to identify the position of the framing blades. This enables the measurement of blade position.

1(c) Minimization of Area Penalty Associated with Deadzones

Since chip size is important from a cost standpoint, the additional area needed for the dead-zones DZ is undesirable. We propose a design system, which optimizes the chip layout such that the dead-zone DZ can be minimized. This takes advantage of the fact that a chip is composed of many lithographic levels, only one or a few of which are to have the dual exposure process. Thus, the area consumed by the dead-zone DZ can be utilized on another level.

Figures 14A, 14B:
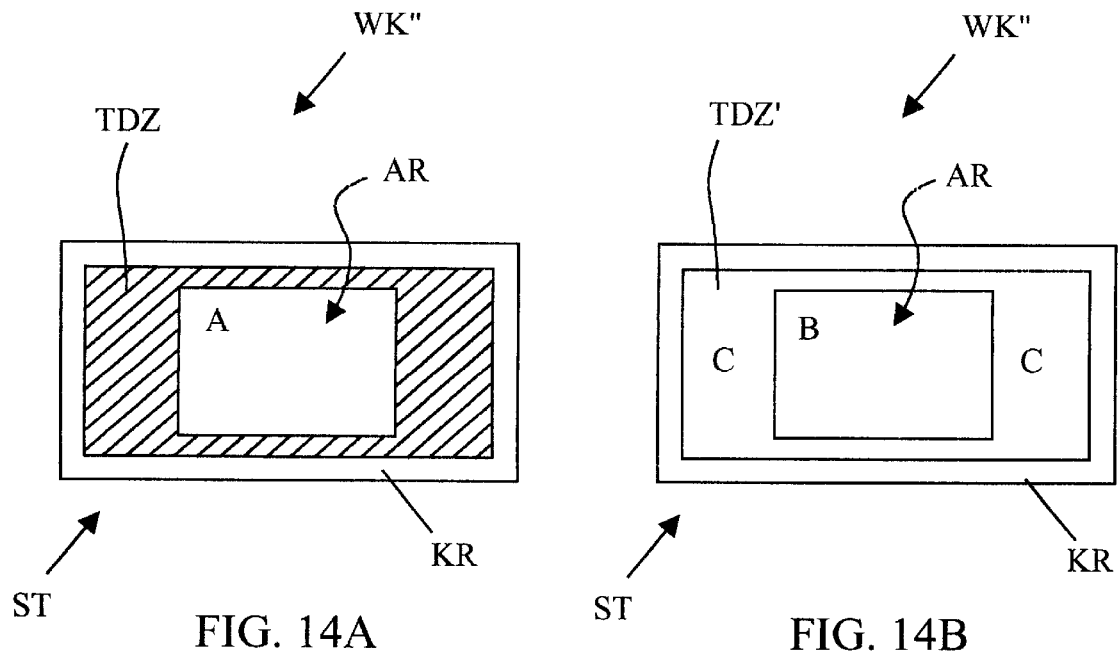
FIG. 14A show an example of a workpiece which has been provided with a temporary dead zone.
FIG. 14B shows the workpiece of FIG. 14A at a subsequent level in which patterns have been printed in the previous dead zone.

FIG. 14A show an example of a workpiece WK" which has been provided with a temporarily dead zone TDZ during a dual (plural) exposure process in accordance with this invention.

FIG. 14B shows the workpiece of FIG. 14A at a subsequent level in which patterns have been printed in the previous dead zone TDZ"

In FIG. 14A, a nanostepped level is used, which has the opaque temporary deadzones TDZ. Patterns of type "A" are exposed using the dual exposure process as described above in array portion AR.

FIG. 14B illustrates how during a subsequent level patterns of type "B" can be printed in the array portion AR and at the same time the dead zone regions TDZ that were unused in FIG. 14A can be used as printable zones TDZ' to print patterns of type "C". In other words, after the first exposure of a dual exposure system in accordance with this invention, the dead-zone area TDZ of FIG. 14A becomes a printable zone TBZ' used in a later step in the process. The design engine can optimize the chip layout such that the dead-zones TDZ are filled with patterns in buffer zones TBZ' in FIG. 14B on alternative levels such that the chip area increase is minimized.

(2) Steppable Overlay Marks

We have just described a series of process steps which protect overlay marks and other measurement structures in the kerf KR during a second exposure in accordance with the dual exposure process of this invention. An alternative option is to avoid the option of protecting the kerf KR and instead to form measurement structures from the dual exposure process. In this case, the plural exposures expose the entire chip, array portion AR and kerf KR, without any involvement from the stepper-framing-blades SFB. An embodiment of a composite overlay mark is shown in FIGS. 16A and 16B.

Figures 15, 16:
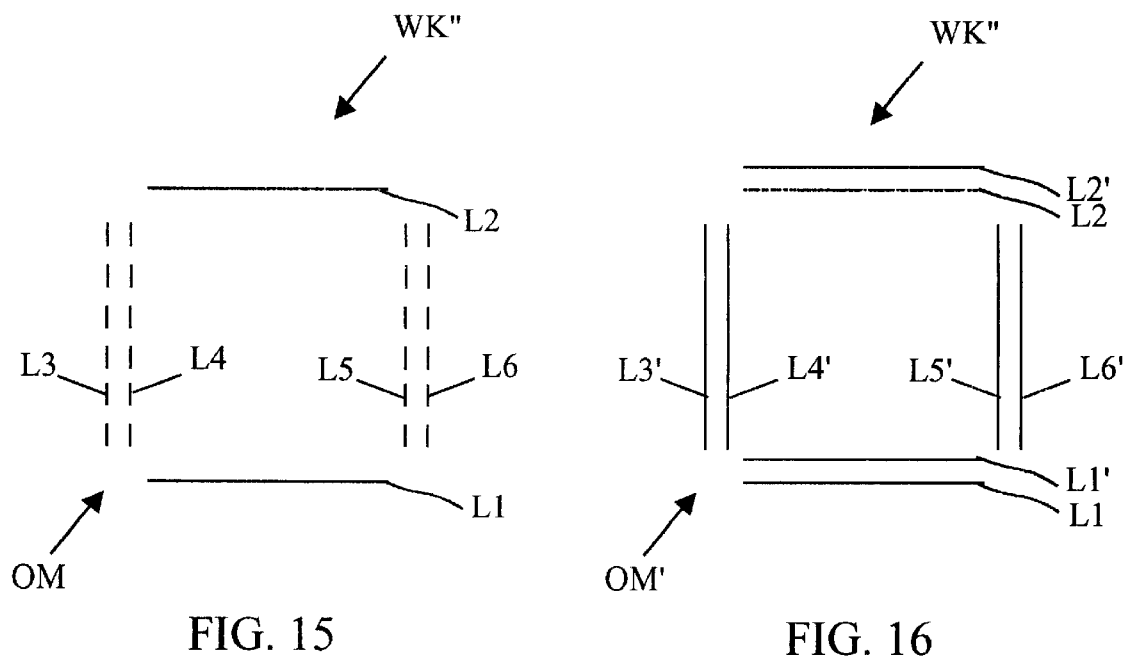
FIGS. 15 and 16 show an example of how the process of this invention forms a composite overlay mark by dual sequential exposures before and after a nanostep.

FIGS. 15 and 16 show an example of how the process of this invention forms a composite overlay mark OM/OM' by dual sequential exposures before and after a nanostep.

FIG. 15 shows an original overlay mark OM produced by a reticle mask during the first exposure of a workpiece with lines L1, L2 at the top and bottom and dotted lines L3 and L4 on the left and dotted lines L5 and L6 on the right.

FIG. 16 shows the result after a nanostep of the reticle mask (not shown) in the vertical direction. The resultant composite image of FIG. 16 is identical to the traditional image. The lines L1 and L2 at the top and bottom have been supplemented by lines L1' and L2' above lines L1 and L2 respectively. The dotted lines L3 and L4 on the left and dotted lines L5 and L6 on the right have been replaced by solid lines L3' and L4' on the left and dotted lines L5' and L6' on the right since the dotted lines complement the dotted lines to produce the solid lines in the overlay mark OM'.

Plural Nanostep Per Field Embodiment of the Invention

FIGS. 17 and 18A–18C illustrate a modification of the invention employing a plurality (three) nanosteps with a reticle mask RF". The reticle mask RF" is adapted to triple exposures for each field exposed on the workpiece. This embodiment of the invention shows how the invention may be employed when the original reticle mask is deconstructed to require "n" exposures for each field where "n" is a positive integer. In this case n=3.

Figure 17:
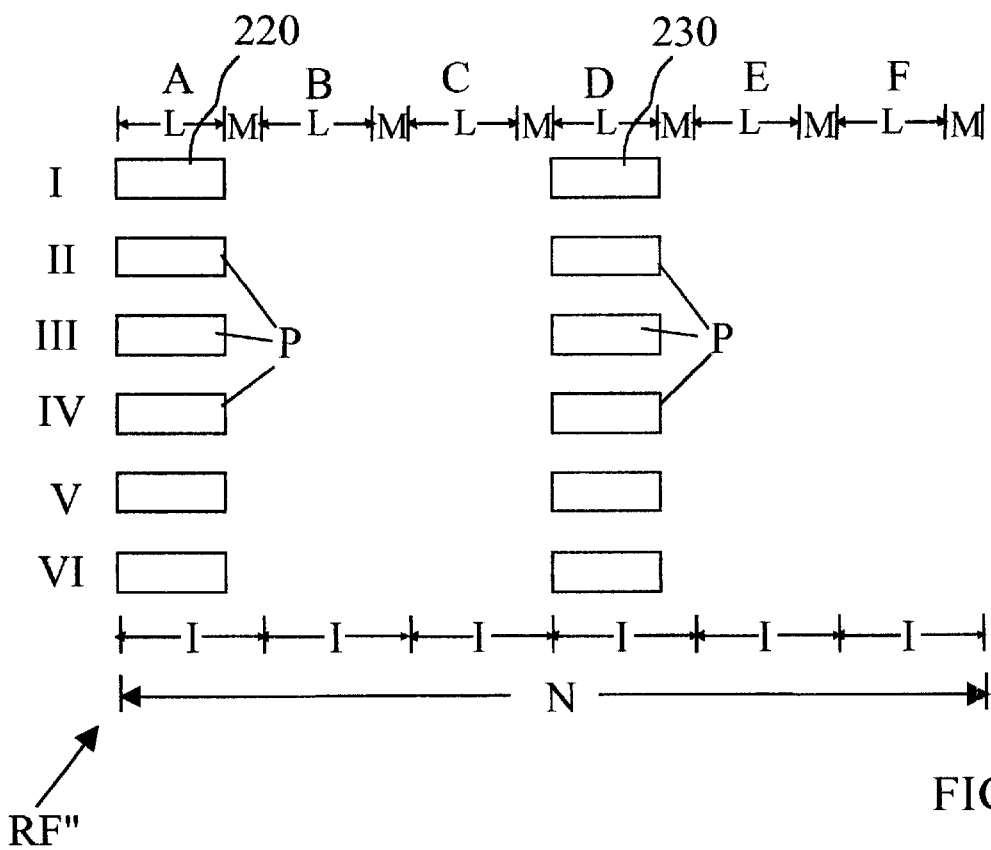
FIG. 17 shows a reticle mask which has a mask layout that is a modification of the layout shown in FIG. 4.

FIG. 17 shows a reticle mask RF" which has a mask layout that is a modification of the layout shown in FIG. 4. The layout of reticle mask RF" of FIG. 17 is suitable for use an interleaved triple exposure process using a single reticle mask and intermediate two nanosteps between exposures to form the pattern shown in FIG. 3 in accordance with the method of this invention.

Figure 18A:
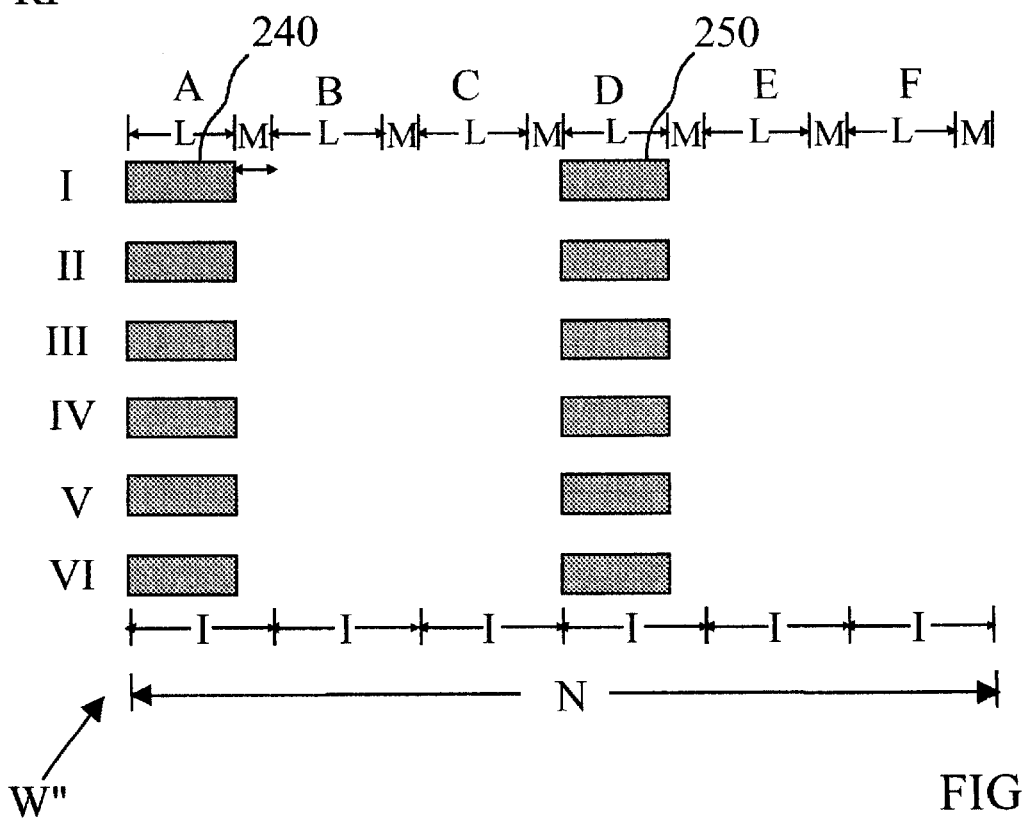
FIGS. 18A, 18B and 18C illustrate a triple exposure process used to form a final desired pattern.
Figure 18B:
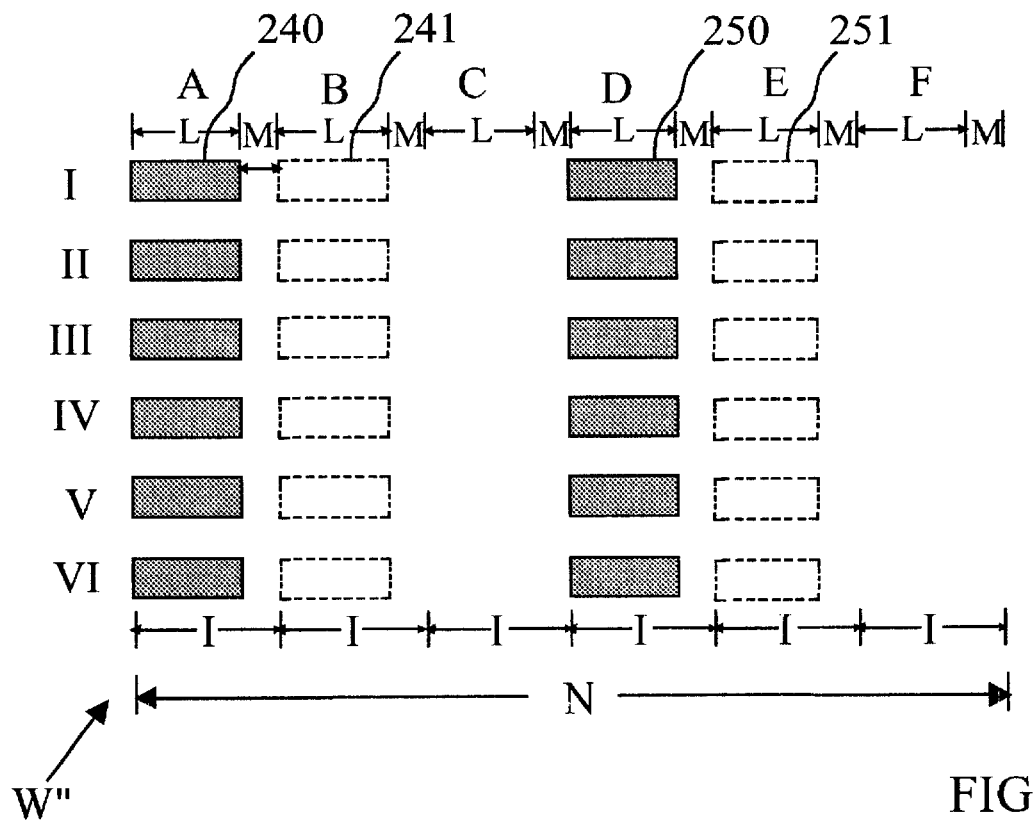
Figure 18C:
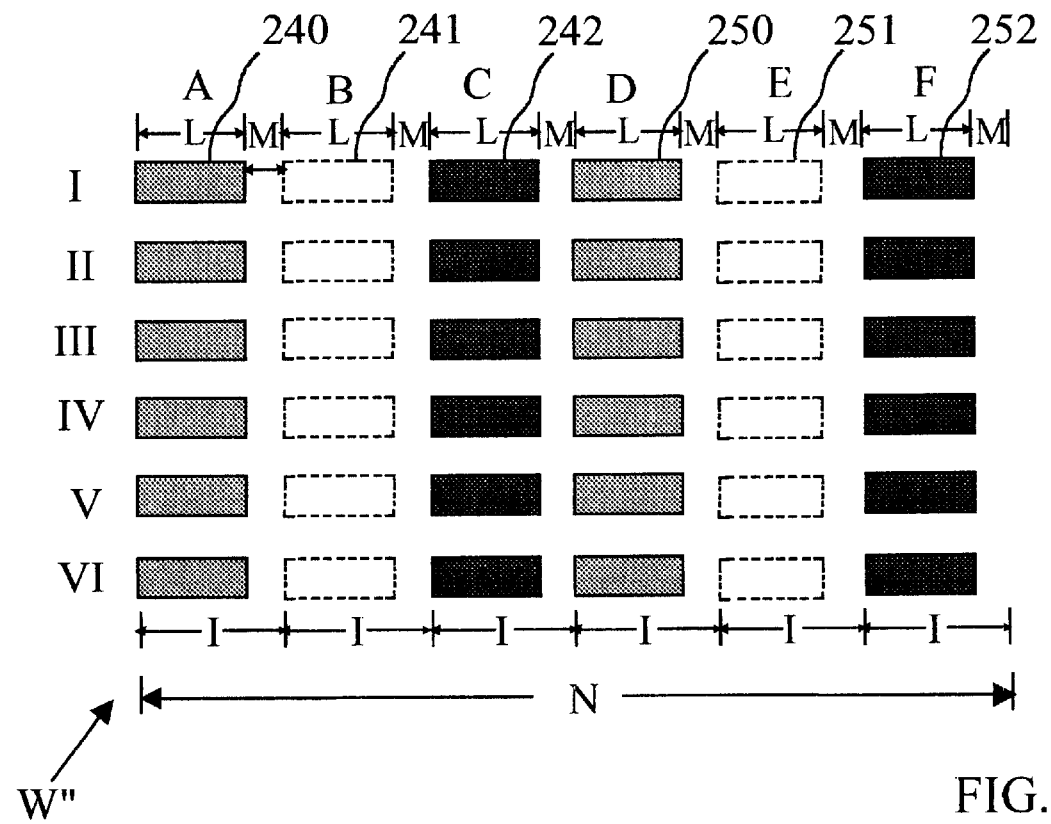

FIGS. 18A, 18B and 18C illustrate a triple exposure process used to form final desired pattern in accordance with this invention by "nanostepping" in which distances of stage movement are quite small compared with typical stage movements during wafer exposure in which the reticle is moved the full length of the reticle between exposures in what is referred to as a full step.

FIG. 18A shows a workpiece W" which was exposed to only a first exposure in a first position to a field of patterns P on the triple exposure reticle RF" of FIG. 17 in accordance with this invention.

Subsequent to the first exposure shown in FIG. 18A, instead of moving the length of the entire field on the mask RF", the exposure tool stage is then moved a first ultra small "nanostep" and exposed again to fill in some of the remaining patterns P as shown in FIG. 18B. The "stage" is the portion of the tool upon which the workpiece W" which is being located. Again, the stage is precisely moved by a precision stepper motor by a conventional commercially available step-and-repeat machine of the kind well known by those skilled in the art programmed to move the workpiece W relative to the reticle in accordance with this invention.

Subsequent to the second exposure shown in FIG. 18B, the exposure tool stage is moved a second ultra small "nanostep" and exposed again to fill in the remaining patterns as shown in FIG. 18C.

FIG. 18C shows the workpiece W" of FIG. 18B after the third one of the triple exposures to the field of patterns P on the reticle RF" which in this case have been exposed in a second position an interval "I" away from the first exposure. This completes the dual-interleaved exposure process of the first field of a series of fields to be exposed by a stepper in the dual exposure process in accordance with this invention. Thus, FIG. 18C shows a field of patterns P which have been exposed in first, second and third exposures in a triple exposure process in accordance with this invention.

In FIG. 17 the patterns P for columns B, C, E and F have been omitted from the reticle mask RF". In the position shown, the reticle mask RF" of FIG. 17 exposes only columns A and D of the first field to be exposed.

In FIG. 18A the workpiece W" is shown after having received an exposure that is the result of the first exposure with the mask RF" of FIG. 17 in its initial position relative to workpiece W".

To produce the result seen in FIG. 18B requires repeating the use of the mask RF" of FIG. 17 only after the workpiece W" and mask RF" has been been nanostepped by the distance "I" (i.e. interval "I") to a second position. There, the second exposure position, reticle mask RF" is employed to expose the complementary patterns P in columns B and E to the patterns of columns A and D of FIG. 18A to produce the pattern seen in FIG. 18B.

To complete the exposure of a single field as shown in FIG. 18C the the mask RF" of FIG. 17 is used once again only after the relative position of the workpiece W" and mask RF" was been nanostepped an additional distance "I" (i.e. interval "I") to a third position. In the third exposure position, reticle mask RF" is employed to expose the complementary patterns P in columns C and F to the exposures of A, B, C and D of FIG. 18B to produce the pattern seen in FIG. 18C.

Then after the exposure of patterns P for columns A–E, the relative position of reticle RF" with respect to the workpiece W' must move the distance N–2I to expose the columns A and D of the next field which is to be exposed.

Preparation of Plural Exposure Reticle Mask

Figure 19:
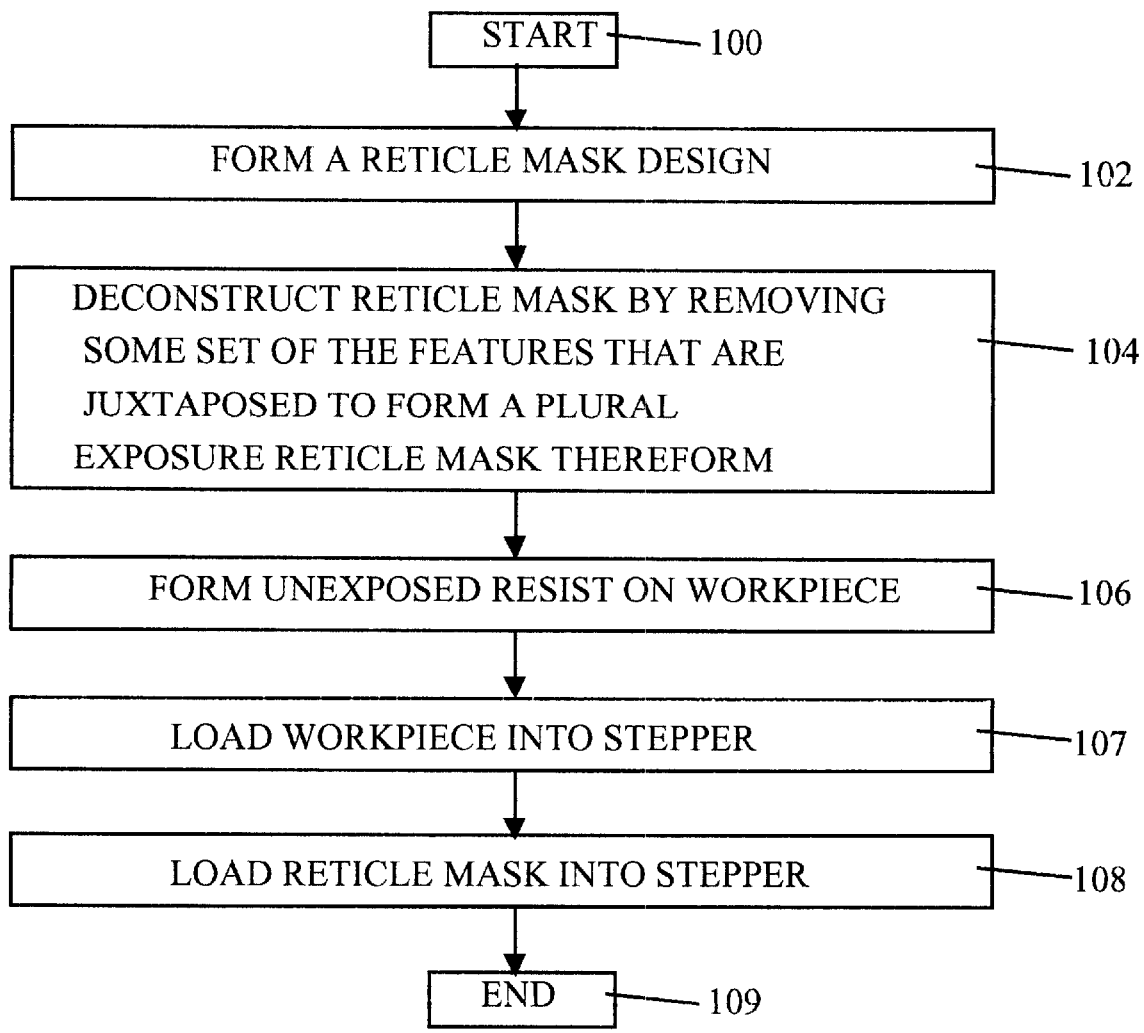
FIG. 19 is a flow chart which shows steps of the process for forming a plural exposure reticle mask.

FIG. 19 is a flow chart which shows steps of the process for forming a plural exposure reticle mask in accordance with this invention as follows:
1) In step 100 the process Starts;
2) In step 102, form a design for a reticle mask;
3) In step 104, deconstruct the design for the reticle mask by removing some set(s) of the features that are juxtaposed leaving a mask suitable for use in reconstructing the design by nanostepping the deconstructed reticle mask while making a series of exposures therethrough;
4) In step 106, form unexposed resist (e.g. photoresist reticle masking material) on workpiece;
5) In step 107, load the workpiece into stepper;
6) In step 108, load the reticle mask into stepper; and
7) In step 109 the process ENDs.

Dual Exposure Process

Figure 20A:
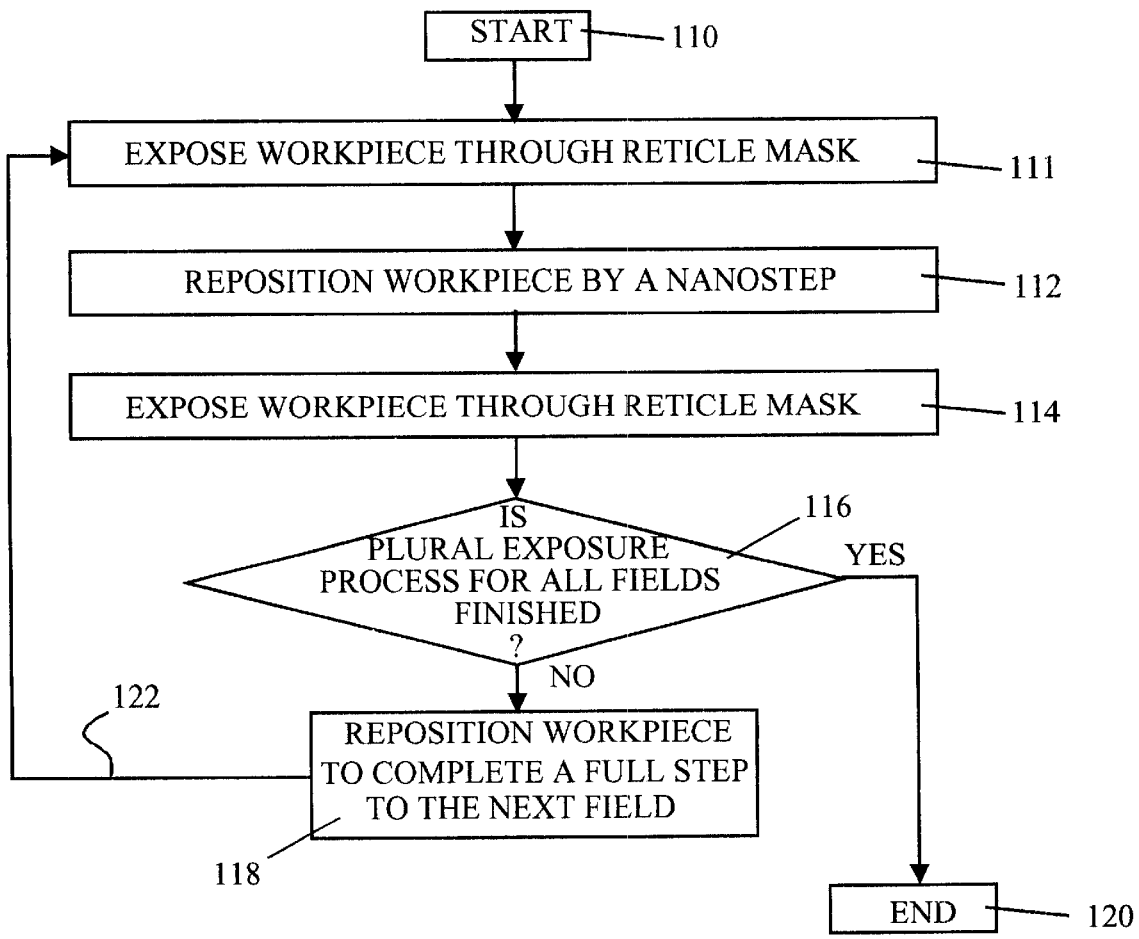
FIG. 20A is a flow chart which shows a dual exposure process.

FIG. 20A is a flow chart which shows a dual exposure process in accordance with this invention, as follows:
1) In step 111, expose workpiece through reticle mask;
2) In step 112, reposition workpiece by a nanostep;
3) In step 114, expose workpiece through reticle mask;
4) In step 116, a test is made which is "Is dual exposure finished?";
5) If the result of the test in step 116 is NO the process loops back along line 122 to step 111 to repeat the process from there; and
6) If the result of the test in step 116 is YES then the process goes to the END 120.

Dual Exposure Process With Stepper-framing-blades

Figure 20B:
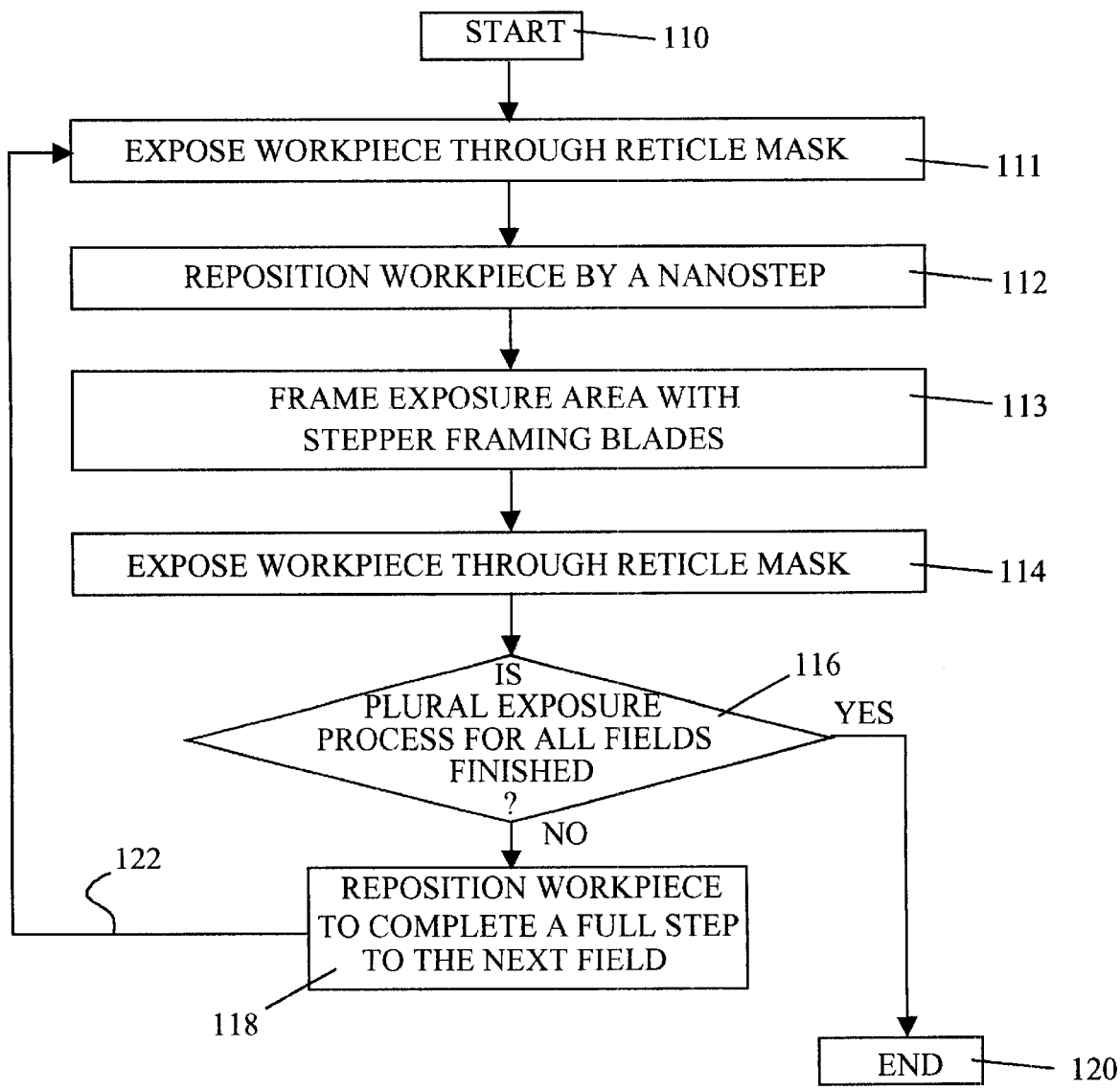
FIG. 20B is a flow chart which shows the process of FIG. 20A to which use of stepper-framing-blades has been added.

FIG. 20B is a flow chart which shows the process of FIG. 20A to which use of stepper-framing-blades has been added in accordance with this invention, as follows:
1) In step 111, expose workpiece through reticle mask;
2) In step 112, reposition workpiece by a nanostep;
3) In step 113, frame the exposure area with the stepper-framing-blades;
4) In step 114, expose workpiece through reticle mask;
5) In step 116, a test is made which is "Is dual exposure finished?";
6) If the result of the test in step 116 is NO the subject process in accordance with this invention loops back along line 122 to step 111 to repeat the process from there; and
7) If the result of the test in step 116 is YES then the process goes to the END 120.

Plural Exposure Process

Figure 20C:
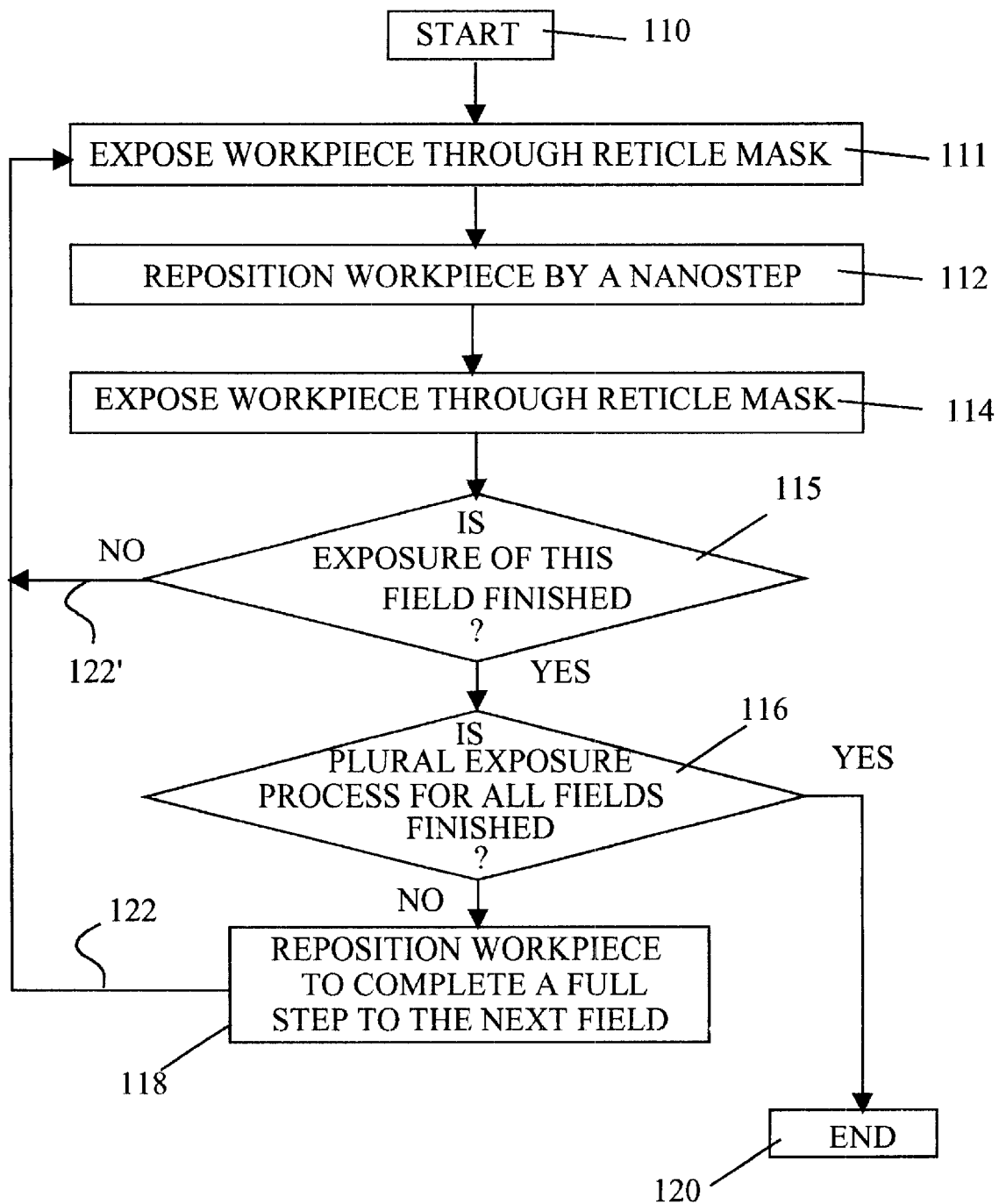
FIG. 20C is a flow chart which shows a plural exposure process.

FIG. 20C is a flow chart which shows a plural exposure process in accordance with this invention, as follows:
1) In step 111, expose workpiece through reticle mask;
2) In step 112, reposition workpiece by a nanostep;
3) In step 114, expose workpiece through reticle mask;
4) In step 115, a test is made which is "Is exposure of this field finished?", i.e. does the number of exposures equal "n"; and if NO, loop back along line 122' to line 122 to step 111 to repeat the process from there;
5) In step 116, a test is made which is "Is the plural exposure process for all fields finished?";
6) If the result of the test in step 116 is NO the process loops back along line 122 to step 111 to repeat the process from there; and
7) If the result of the test in step 116 is YES then the process goes to the END 120.

Plural Exposure Process With Stepper-framing-blades

Figure 20D:
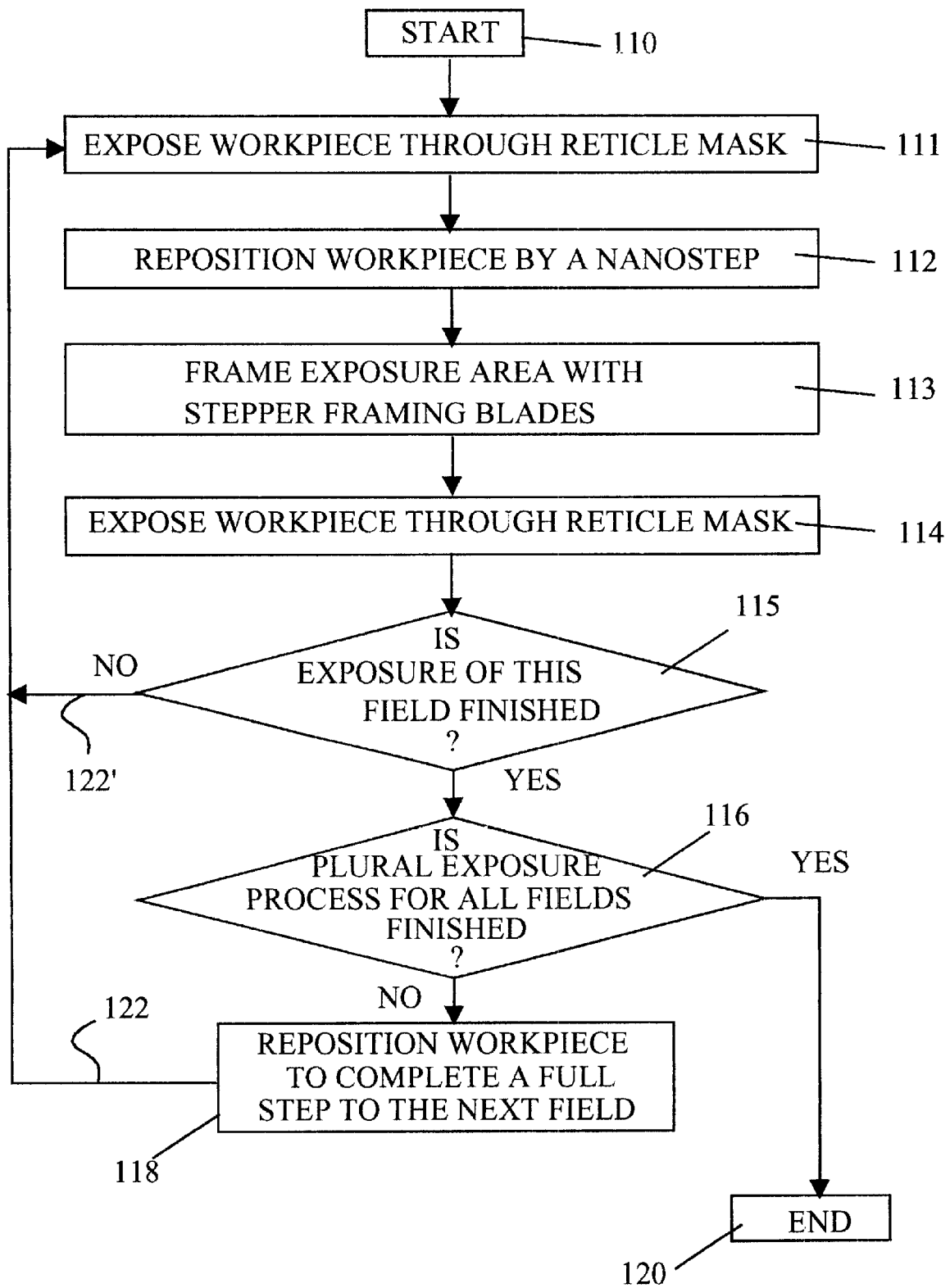
FIG. 20D is a flow chart which shows the process of FIG. 20C to which use of stepper-framing-blades has been added.

FIG. 20D is a flow chart which shows the process of FIG. 20C to which use of stepper-framing-blades has been added in accordance with this invention, as follows:
1) In step 111, expose workpiece through reticle mask;
2) In step 112, reposition workpiece by a nanostep;
3) In step 113, frame the exposure area with the stepper-framing-blades;
4) In step 114, expose workpiece through reticle mask;
5) In step 115, a test is made which is "Is exposure of this field finished?", i.e. does the number of exposures equal "n"; and if NO, loop back along line 122' to line 122 to step 111 to repeat the process from there;
6) In step 116, a test is made which is "Is the plural exposure process for all fields finished?";
7) If the result of the test in step 116 is NO the process loops back along line 122 to step 111 to repeat the process from there; and
8) If the result of the test in step 116 is YES then the process goes to the END 120.

Alternatively, the workpiece can be fully exposed first by stepping a series of full steps from the start position to the end of the area to be exposed. Then go back to the starting position. Then make a nanostep to reset the starting position. At that point re-expose from the reset starting position in the same way with a series of full steps from the reset starting position which carries the nanostep offset forward.

Alternative Dual Exposure Process

Figure 21A:
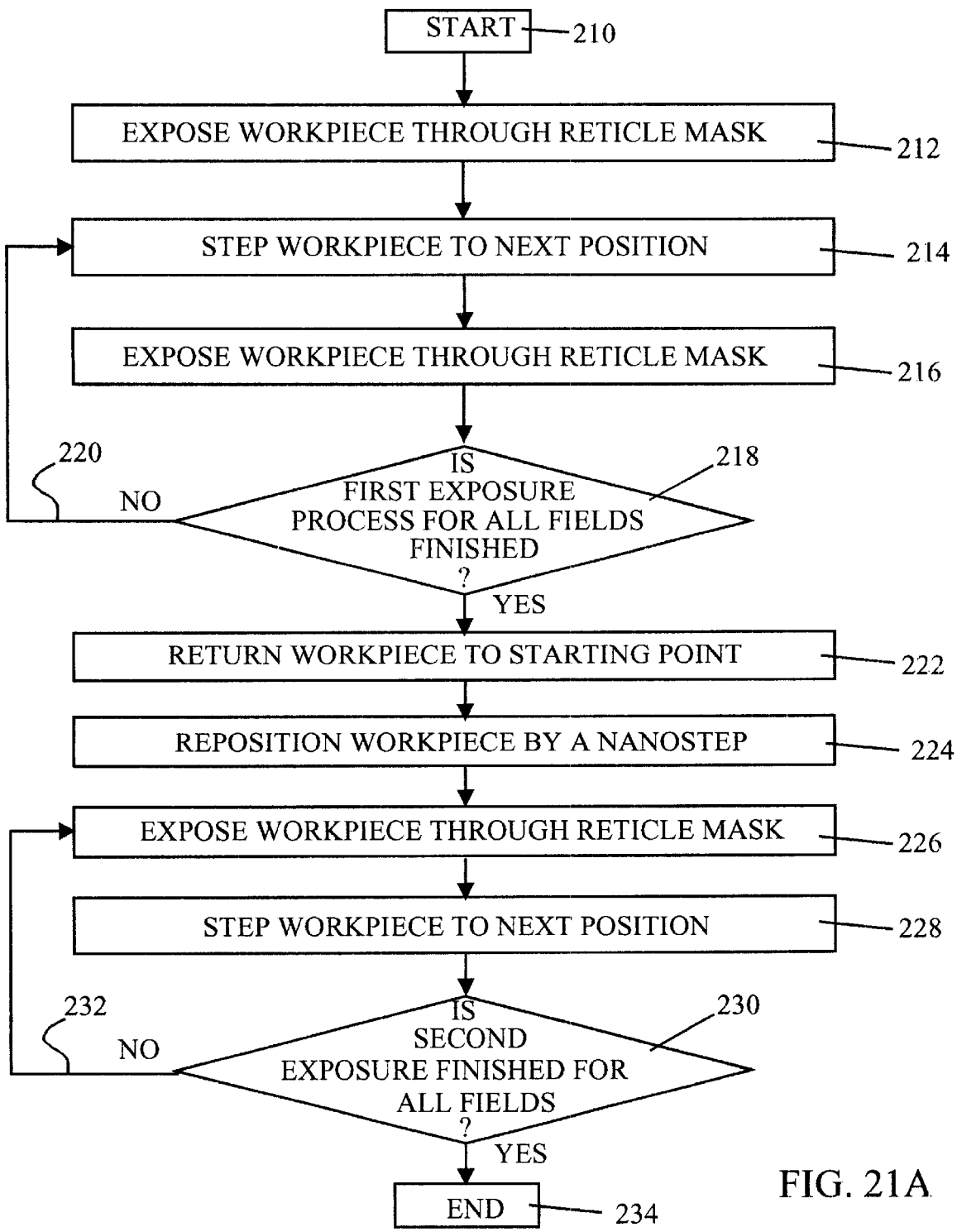
FIG. 21A is a flow chart which shows a dual exposure process which is a modification of FIG. 20A in which the nanostep is deferred until after a first exposure of the entire workpiece.

FIG. 21A is a flow chart which shows a dual exposure process in accordance with this invention which is a modification of FIG. 20A in which the nanostep is deferred until after a first exposure of the entire workpiece. Then the stepper is reset by a nanostep and the exposure continues as follows:
1) Starting the process at Start 210, in step 212, expose the workpiece through a plural exposure reticle mask;
2) In step 214, step the workpiece to the next position;
3) In step 216, expose workpiece through reticle mask;
4) In step 218, a test is made, which is "Is the first exposure process for all fields finished?";
5) If the result of the test in step 218 is NO the process loops back along line 220 to step 214 to repeat the process from there;

6) If the result of the test in step 218 is YES then the process goes to step 222;
7) In step 222, return the workpiece to the starting point or to the equivalent position reached after step 8) below;
8) In step 224, reposition workpiece by a nanostep;
9) In step 226, expose workpiece through reticle mask once again offset by the nanostep;
10) In step 228, step the workpiece to the next position;
11) In step 230, a test is made, which is "Is the second exposure finished for all fields?";
12) If the result of the test in step 230 is NO the process loops back along line 232 to step 226 to repeat the process from there; and
13) If the result of the test in step 230 is YES then the process goes to the END 234.

Alternative Dual Exposure Process With Stepper-framing-blades

Figure 21B:
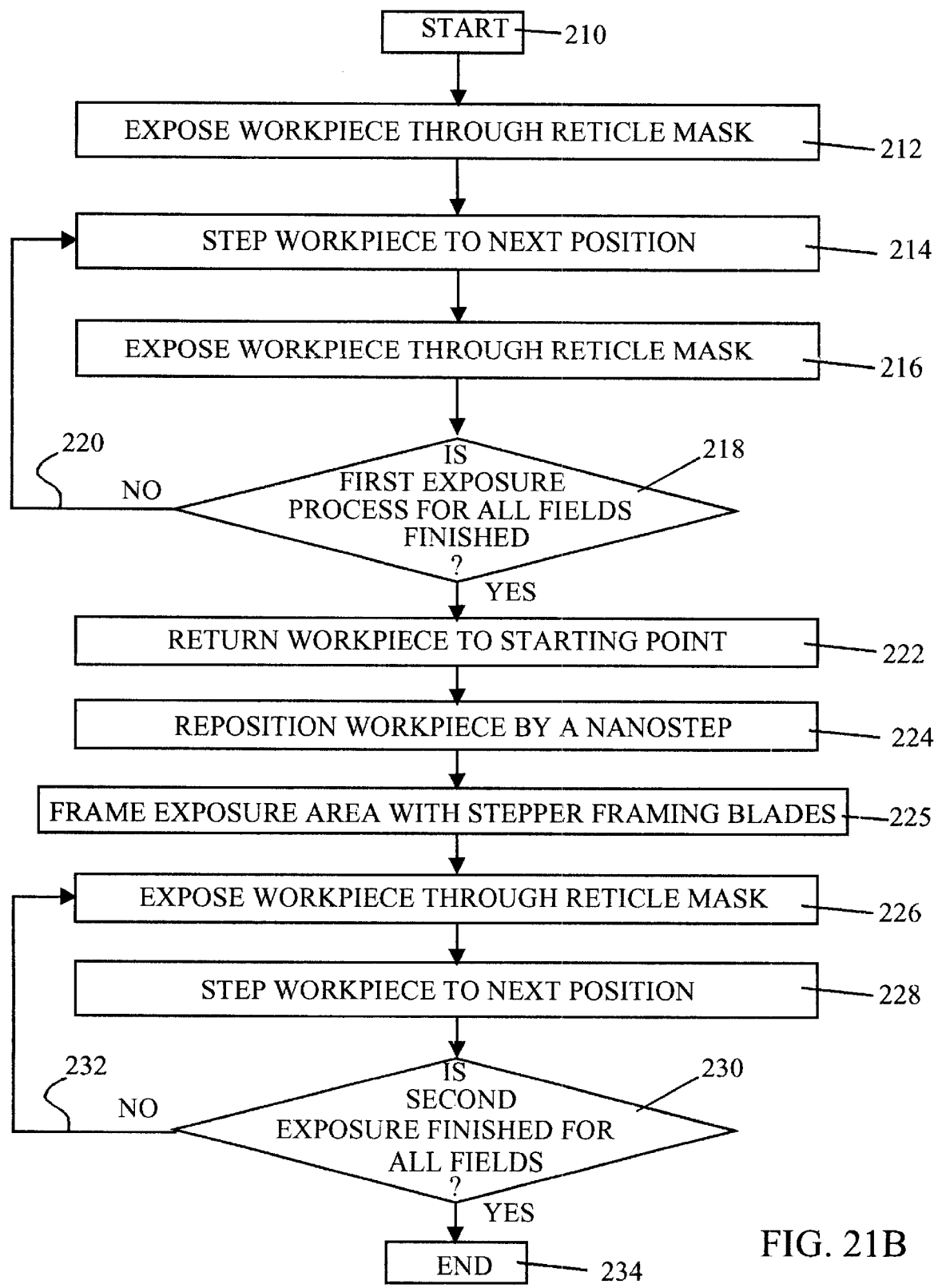
FIG. 21B is a flow chart which shows the process of FIG. 21A to which use of stepper-framing-blades has been added.

FIG. 21B is a flow chart which shows the process of FIG. 21A to which use of
1) starting the process at Start 210, in step 212, expose the workpiece through a plural exposure reticle mask;
2) In step 214, step the workpiece to the next position;
3) In step 216, expose workpiece through reticle mask;
4) In step 218, a test is made, which is "Is the first exposure process for all fields finished?";
5) If the result of the test in step 218 is NO the process loops back along line 220 to step 214 to repeat the process from there;
6) If the result of the test in step 218 is YES then the process goes to step 222;
7) In step 222, return the workpiece to the starting point or to the equivalent position reached after step 8) below;
8) In step 224, reposition workpiece by a nanostep;
9) In step 225, frame exposure area with stepper framing blades;
10) In step 226, expose workpiece through reticle mask once again offset by the nanostep;
11) In step 228, step the workpiece to the next position;
12) In step 230, a test is made, which is "Is the second exposure finished for all fields?";
13) If the result of the test in step 230 is NO the process loops back along line 232 to step 226 to repeat the process from there; and
14) If the result of the test in step 230 is YES then the process goes to the END 234.

An additional problem with arrangements of this sort is the formation of side lobes related to interaction of the layout with the reticle mask and the exposure tool projection lens. This typically limits how closely features can be placed together. The method of this invention relieves concerns about both the imaging and reticle mask and solves some practical problems associated with multiple exposures.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method for printing an array of identical pattern elements in a microcircuit each pattern element having a length L with adjacent pattern elements being spaced apart by a distance M and with adjacent pattern elements repeating at an interval I in a scanning direction where I=L+M comprising:
   (a) forming a mask comprising a fraction of the array of identical pattern elements spaced apart by more than one interval I in the scanning direction,
   (b) exposing a workpiece through said mask,
   (c) repositioning the workpiece relative to the mask by a distance comprising a nanostep of at least one interval I in the scanning direction,
   (d) re-exposing said workpiece through said mask,
   (e) repositioning the workpiece relative to the mask by a distance comprising a step of a plurality of intervals I, and
   (f) returning to perform steps (b) through (e) until the workpiece has been exposed.

2. A method for printing an array of identical pattern elements spaced apart by more than one interval I in a microcircuit each pattern element having a length L with adjacent pattern elements being spaced apart by a distance M and with adjacent pattern elements repeating at an interval I in a scanning direction where I=L+M comprising:
   (a) forming a mask comprising a fraction of the array of identical pattern elements spaced apart by more than one interval I in the scanning direction,
   (b) exposing a workpiece through said mask,
   (c) repositioning the workpiece relative to the mask by a distance comprising a step in the scanning direction,
   (d) re-exposing said workpiece through said mask and repeating steps (b) and (c) until the workpiece has been exposed once,
   (e) returning the workpiece to the start position,
   (f) repositioning the workpiece relative to the mask by a distance comprising a nanostep of at least one interval I in the scanning direction,
   (g) re-exposing said workpiece through said mask,
   (e) repositioning the workpiece relative to the mask by a distance comprising a step, and
   (f) returning to perform steps (g) through (h) until the workpiece has been re-exposed.

3. A method for exposing a workpiece by printing an array of identical pattern elements in a microcircuit each pattern element having a length L with adjacent pattern elements being spaced apart by a distance M and with adjacent pattern elements repeating at an interval I in a scanning direction where I=L+M in a dual exposure step-and-repeat process by the steps as follows:
   (a) form a design for a reticle mask;
   (b) deconstruct the design for the reticle mask by removing a set(s) of the features that are juxtaposed leaving an interval I in the mask without a pattern element to be printed onto the workpiece;
   (c) form unexposed resist on the workpiece;
   (d) load the workpiece and the reticle mask into the stepper;
   (e) expose the workpiece through the reticle mask 111);
   (f) reposition the workpiece by a nanostep (112, 224) in the scanning direction; and
   (g) expose the workpiece through the reticle mask after the repositioning (114, 226).

4. The method of claim 3 wherein the steps are performed after step (e) as follows:

(h) then step the workpiece to a next position (214) in the scanning direction, (i) then expose the workpiece through the reticle mask 216);

(j) test whether the plural exposure process is finished (218);

(k) if the result of the test in step (i) is NO then loop back to step (h) to repeat the process from there (220, 214);

(l) if the result of the test in step (h) is YES then return the workpiece to starting point (222) and (m) perform step (f) by repositioning the workpiece by a nanostep (224), (n) perform step (g) expose the workpiece through the reticle mask after the repositioning (226), (o) step the workpiece to a next position (228), (p) after step (o) test whether the second exposure process is finished for all fields (230);

(q) if the result of the test in step (p) is NO the process loops back to step (o) to repeat step (o) and repeat step (p);

(r) if the result of the test in step (p) is YES the process comes to an end (234).

5. The method of claim 3 wherein the steps are performed after step (g) as follows:

(h) test whether the plural exposure process for all fields is finished (116);

(i) if the result of the test in step (h) is NO, then reposition the workpiece to complete a full step to the next field (118) and loop back (122) to step (e) to repeat the process from there (111);

(k) if the result of the test in step (h) is YES then the process is complete and ends (120).

6. The method of claim 3 wherein the reticle mask includes producing an overlay mark by plural exposures of a single mark.

7. A method for exposing a workpiece in a dual exposure step-and-repeat process by the steps as follows:

(a) form a design for a reticle mask;

(b) deconstruct the design for the reticle mask by removing a set(s) of the features that are juxtaposed;

(c) form unexposed resist on the workpiece;

(d) load the workpiece and the reticle mask into the stepper;

(e) expose the workpiece through the reticle mask 111);

(f) reposition the workpiece by a nanostep (112, 224);

(g) expose the workpiece through the reticle mask after the repositioning (114, 226; and a dead zone is provided surrounding an array region in which printing occurs subsequent to exposure in an original exposure.

8. A method for exposing a workpiece in a dual exposure step-and-repeat process by the steps as follows:

(a) form a design for a reticle mask;

(b) deconstruct the design for the reticle mask by removing a set(s) of the features that are juxtaposed;

(c) form unexposed resist on the workpiece;

(d) load the workpiece and the reticle mask into the stepper;

(e) expose the workpiece through the reticle mask 111);

(f) reposition the workpiece by a nanostep (112, 224);

(g) expose the workpiece through the reticle mask after the repositioning (114, 226); and a dead zone is provided surrounding an array region in which printing occurs subsequent to exposure in an original exposure and after step (f) moving stepper-framing-blades over the dead zone to prevent additional exposure thereof in step (g).

9. A method for exposing a workpiece by printing an array of identical pattern elements in an array of identical pattern elements spaced apart by more than one interval I in a microcircuit, with each pattern element having a length L and with adjacent pattern elements being spaced apart by a distance M and with adjacent pattern elements repeating at an interval I in a scanning direction where I=L+M in a plural exposure step-and-repeat process by the steps as follows:

(a) form a design for a reticle mask;

(b) deconstruct the design for the reticle mask by removing alternate ones of features that are juxtaposed spaced apart by a plurality of distances M;

(c) form unexposed resist on the workpiece;

(d) load the workpiece and the reticle mask into the stepper;

(e) expose the workpiece through the reticle mask (111);

(f) reposition the workpiece by a nanostep (112, 224) of at least one interval I in the scanning direction; and (g) expose the workpiece through the reticle mask after the repositioning (114, 226).

10. The method of claim 9 wherein the steps are performed after step (e) as follows:

(h) step the workpiece to a next position (214) spaced apart by a plurality of distances M, (i) expose the workpiece through the reticle mask (216);

(j) test whether the plural exposure process is finished (218);

(k) if the result of the test in step (j) is NO then loop back to step (h) to repeat the process from there (220, 214);

(m) if the result of the test in step (j) is YES then return the workpiece to starting point (222) and (n) perform step (g) by repositioning the workpiece by a nanostep (224), (o) perform step (h) expose the workpiece through the reticle mask after the repositioning (226), (p) step the workpiece to a next position (228), (p) after step (o) test whether the second exposure process is finished for all fields (230);

(q) if the result of the test in step (p) is NO the process loops back to step (o) to repeat step (o) and repeat step (p); and (r) if the result of the test in step (p) is YES the process comes to an end (234).

11. The method of claim 9 wherein the reticle mask includes producing an overlay mark by plural exposures of a single mark.

12. The method of claim 9 wherein a dead zone is provided surrounding an array region in which printing occurs subsequent to exposure in an original exposure.

13. The method of claim 9 wherein a dead zone is provided surrounding an array region in which printing occurs subsequent to exposure in an original exposure, and after step (f) moving stepper-framing-blades over the dead zone to prevent additional exposure thereof in step (g).

* * * * *